United States Patent
Matsudaira et al.

(10) Patent No.: US 11,181,373 B2
(45) Date of Patent: Nov. 23, 2021

(54) VIBRATION TYPE GYROSCOPE

(71) Applicant: DENSO CORPORATION, Kariya (JP)

(72) Inventors: Nobuaki Matsudaira, Kariya (JP); Yoshikazu Furuta, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/018,209

(22) Filed: Sep. 11, 2020

(65) Prior Publication Data
US 2020/0408526 A1 Dec. 31, 2020

Related U.S. Application Data

(63) Continuation of application No. PCT/JP2019/003655, filed on Feb. 1, 2019.

(30) Foreign Application Priority Data

Mar. 29, 2018 (JP) .............................. JP2018-064591

(51) Int. Cl.
*G01C 25/00* (2006.01)
*G01C 19/5776* (2012.01)

(52) U.S. Cl.
CPC ......... *G01C 19/5776* (2013.01); *G01C 25/00* (2013.01)

(58) Field of Classification Search
CPC ..... G01C 19/5776; G01C 25/00; H01L 29/84; B81B 7/02
See application file for complete search history.

(56) References Cited

U.S. PATENT DOCUMENTS

| 4,665,748 | A | * | 5/1987 | Peters | ................... | G01C 19/56 |
| | | | | | | 73/504.03 |
| 4,712,426 | A | * | 12/1987 | Peters | ................ | G01C 19/5776 |
| | | | | | | 73/504.04 |
| 9,574,902 | B2 | * | 2/2017 | Okon | ................... | G01C 25/005 |
| 10,191,079 | B2 | * | 1/2019 | Shirazi | ................. | G01P 15/125 |
| 2007/0194842 | A1 | * | 8/2007 | Hotelling | ........... | G01C 19/5719 |
| | | | | | | 329/307 |
| 2012/0096942 | A1 | * | 4/2012 | Hayashi | ............. | G01C 19/5776 |
| | | | | | | 73/504.12 |

(Continued)

FOREIGN PATENT DOCUMENTS

JP 2008-082924 A 4/2008
JP 4763565 B2 8/2011

*Primary Examiner* — David J Bolduc
(74) *Attorney, Agent, or Firm* — Posz Law Group, PLC

(57) ABSTRACT

A vibration type gyroscope uses a resonator formed of a MEMS. At the time of startup, a lock state determination unit stabilizes an amplitude of a drive signal and outputs a lock signal when the amplitude is stabilized. A phase shifter generates an orthogonal signal by shifting, by 90°, the phase of the drive signal, and a phase compensator outputs a phase signal having a phase corresponding to a control signal based on the orthogonal signal and the in-phase signal of the drive signal. A multiplier multiplies a sense signal and the phase signal outputted from the phase compensator, and a control LPF performs filtering on a multiplication result. A control unit inputs a zero level signal to a PI controller during an initial state, and starts phase control by receiving an output signal of the control LPF, and ends the control when the signal is stabilized around the zero level.

16 Claims, 28 Drawing Sheets

(56) References Cited

U.S. PATENT DOCUMENTS

| | | | |
|---|---|---|---|
| 2012/0146740 A1* | 6/2012 | Furuta | H04B 1/0475 332/144 |
| 2013/0100999 A1* | 4/2013 | Furuta | H04B 1/40 375/219 |
| 2014/0169237 A1* | 6/2014 | Furuta | H04B 1/0475 370/278 |
| 2014/0190258 A1* | 7/2014 | Donadel | G01C 19/5776 73/504.12 |
| 2015/0020589 A1* | 1/2015 | Kim | G01C 19/5776 73/504.12 |
| 2015/0057959 A1* | 2/2015 | Ezekwe | G01C 19/5776 702/96 |
| 2015/0153174 A1* | 6/2015 | Kim | G01C 19/5776 73/504.12 |
| 2015/0176992 A1* | 6/2015 | Entringer | G01C 19/567 73/504.12 |
| 2015/0226556 A1* | 8/2015 | Aaltonen | G01C 19/5712 73/504.12 |
| 2015/0226557 A1* | 8/2015 | Aaltonen | H03B 5/364 73/504.12 |
| 2015/0276405 A1* | 10/2015 | Rastegar | G01C 19/5776 73/504.12 |
| 2015/0276407 A1* | 10/2015 | Bhandari | G01C 19/5776 73/504.12 |
| 2016/0003618 A1* | 1/2016 | Boser | G01C 19/5755 73/504.12 |
| 2016/0091339 A1* | 3/2016 | Weinberg | G01C 19/5776 73/1.77 |
| 2016/0161256 A1* | 6/2016 | Lee | H03L 7/087 73/504.12 |
| 2016/0258826 A1* | 9/2016 | Nezuka | G01L 1/2262 |
| 2016/0320187 A1* | 11/2016 | Higuchi | G01C 19/5776 |
| 2017/0019087 A1* | 1/2017 | Nicollini | H03H 11/18 |
| 2017/0023364 A1* | 1/2017 | Gregory | G01P 15/13 |
| 2017/0167875 A1* | 6/2017 | Bhandari | B81B 7/02 |
| 2017/0254645 A1* | 9/2017 | Kanemoto | G01C 19/5726 |
| 2017/0261562 A1* | 9/2017 | Honda | G01R 35/00 |
| 2018/0205572 A1* | 7/2018 | Kishigami | H04L 25/0272 |
| 2018/0226938 A1* | 8/2018 | Kuisma | H03H 9/2405 |
| 2018/0245946 A1* | 8/2018 | Weinberg | G01C 19/5684 |
| 2018/0274924 A1* | 9/2018 | Mecchia | G01C 19/5776 |
| 2018/0274941 A1* | 9/2018 | Quartiroli | G01C 19/5776 |
| 2019/0277656 A1* | 9/2019 | Painter | G01C 25/005 |
| 2020/0011702 A1* | 1/2020 | Clark | G01C 25/005 |
| 2021/0033399 A1* | 2/2021 | Sheard | G01C 19/5684 |

* cited by examiner

VIBRATION TYPE GYROSCOPE

CROSS REFERENCE TO RELATED APPLICATION

The present application is a continuation application of International Patent Application No. PCT/JP2019/003655 filed on Feb. 1, 2019, which designated the U.S. and claims the benefit of priority of Japanese Patent Application No. 2018-064591 filed on Mar. 29, 2018. The entire disclosures of both applications are incorporated herein by reference.

FIELD

The present disclosure relates to a MEMS vibration structure type gyroscope.

BACKGROUND

Gyroscopes of MEMS (micro electro mechanical systems) vibration structure type are widely available because they are inexpensive. However, the MEMS is likely to degrade in accuracy due to a non-ideal state caused by a manufacturing error. FIG. 32 shows, as one conventional example, a general configuration of a gyroscope of a vibrating gyro structure. Here, an open-loop architecture, in which structural parts of the MEMS includes an input terminal Drive In, an output terminal Drive Out and another output terminal Sense Out, is shown exemplarily.

A drive axis oscillation loop is formed of a CA (charge amplifier), a PLL (phase locked loop), and an AGC (automatic gain control) circuit. Since an angular velocity signal Rate generated by the Coriolis force is AM-modulated by a resonance frequency, the angular velocity signal Rate can be obtained by synchronously detecting by the drive axis signal and removing harmonic frequency components by an LPF (low pass filter).

Normally, due to a manufacturing error of the MEMS, an output signal output from the Sense Out terminal includes a quadrature error in addition to the angular velocity signal. Since the quadrature error signal is orthogonal to the angular velocity signal, it can be removed ideally by synchronously detecting a sense axis signal by the drive axis signal. However, in reality, the quadrature signal is mixed with the sensor axis signal as shown in FIG. 33 due to a phase difference θmis between the drive axis signal and the sense axis signal generated in the MEMS or the circuit. Since the quadrature error signal has a larger amplitude than that of the angular velocity signal, the signal accuracy is greatly degraded even if the phase difference is small.

To solve this problem, many techniques for correcting the phase difference θmis to zero have been proposed. For example, it is proposed for reducing a phase difference to perform a periodic phase modulation on a drive axis signal by using a phase adjustment oscillation circuit that oscillates at a frequency lower than a resonance frequency and a phase shift circuit, perform a synchronous detection, and perform a feedback of a detected signal through an integration circuit.

However, since a phase difference between a drive signal and a sense signal is always corrected, an output of a low pass filter includes an angular velocity signal, which affects a phase correction and degrades the correction accuracy. Furthermore, since no countermeasure is taken against the effect that noise generated from the circuit or the MEMS degrades a phase correction accuracy, a high-accuracy phase correction cannot be realized.

SUMMARY

According to a vibration type gyroscope of the present disclosure, a resonator is configured by MEMS structure and has a drive signal input terminal, a drive signal output terminal and a sense signal output terminal, which outputs a sense signal corresponding to an angular velocity applied from an outside in a state modulated by a drive signal. A lock state determination unit is provided in a path extending from the drive signal output terminal to the drive signal input terminal, for stabilizing an amplitude of a drive signal output from the drive signal output terminal to be close to a reference voltage value at a time of activation and outputting a lock signal upon a determination that an amplitude variation has been stabilized. A phase shifter generates a quadrature signal by 90° phase shifting the drive signal. A phase compensator receives an in-phase signal of the drive signal, a quadrature signal and a control signal, and outputs a phase signal having a phase corresponding to the control signal based on the in-phase signal and the quadrature signal. A multiplier multiplies a modulated sense signal by the phase signal output from the phase compensator. A control low pass filter filters a multiplication result of the multiplier. A PI controller performs a proportional and integral calculation. A first multiplexer inputs an output signal of the control low pass filter or a zero level signal to the PI controller by switching. A memory stores a control signal output from the PI controller. A second multiplexer inputs either one of the control signal output from the PI controller and the control signal stored in the memory to the phase compensator. A control unit controls the first multiplexer and the second multiplexer.

BRIEF DESCRIPTION OF THE DRAWINGS

The features and advantages of the present disclosure will become more apparent from the following detailed description made with reference to the accompanying drawings. In the drawings.

DETAILED DESCRIPTION OF THE EMBODIMENT

First Embodiment

Figure 1:
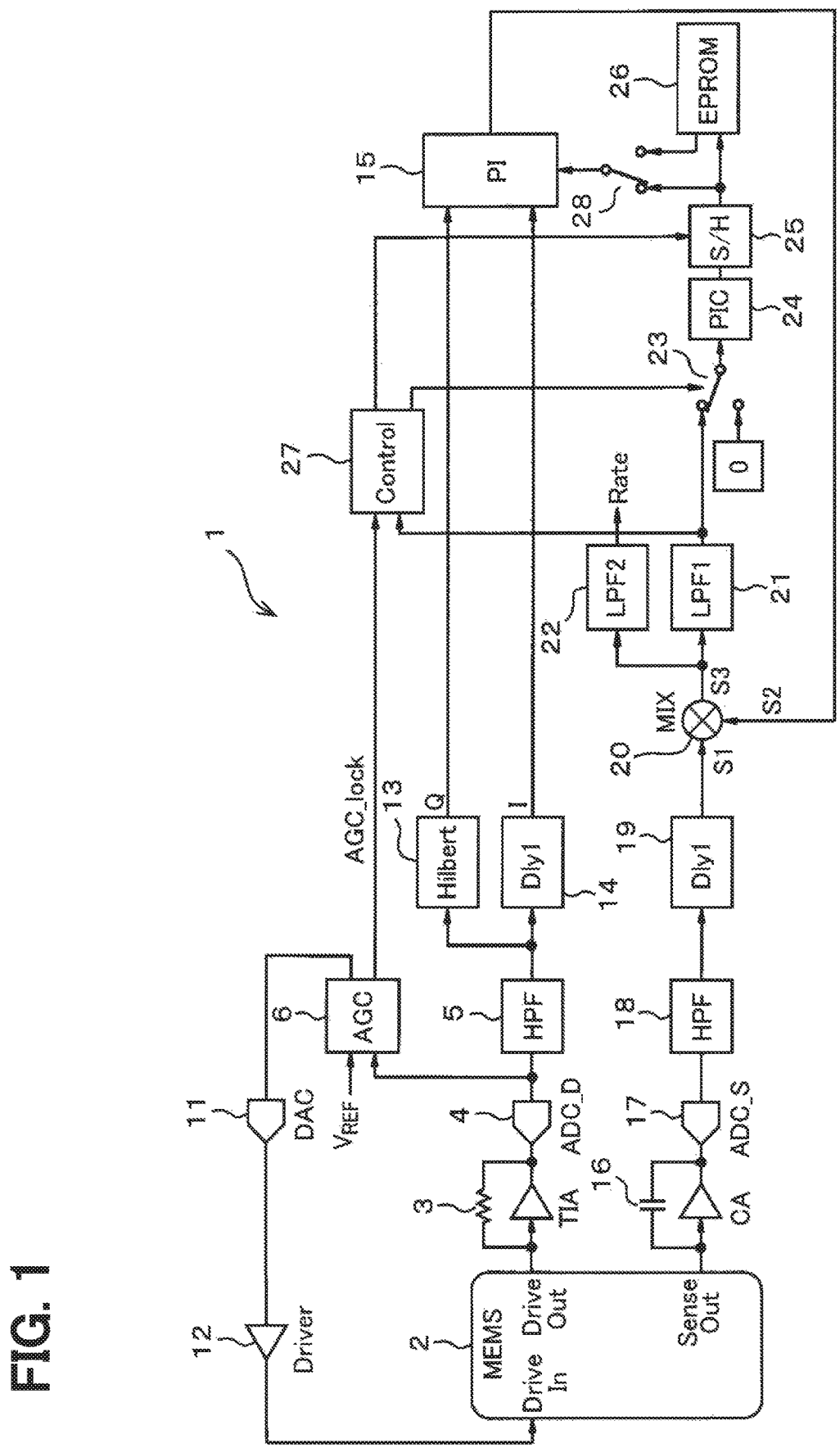
FIG. 1 is a functional block diagram showing a configuration of a vibration type gyroscope according to a first embodiment.

As shown in FIG. 1, a vibration type gyroscope 1 of the present embodiment includes a resonator 2 made of MEMS. The resonator 2 is provided with a drive signal input terminal Drive In, a drive signal output terminal Drive Out, and a sense axis signal output terminal Sense Out. An impedance conversion amplifier indicated as a TIA (trans impedance amplifier) 3, is connected to the output terminal Drive Out so that a capacitance change inside the resonator 2 is converted into a voltage value by the TIA 3. The converted voltage value is converted into digital data by an A/D converter indicated as an ADC_D 4 on a drive side, and input to a high-pass filter HPF 5 and a gain adjuster indicated as an AGC circuit 6.

Figure 2:
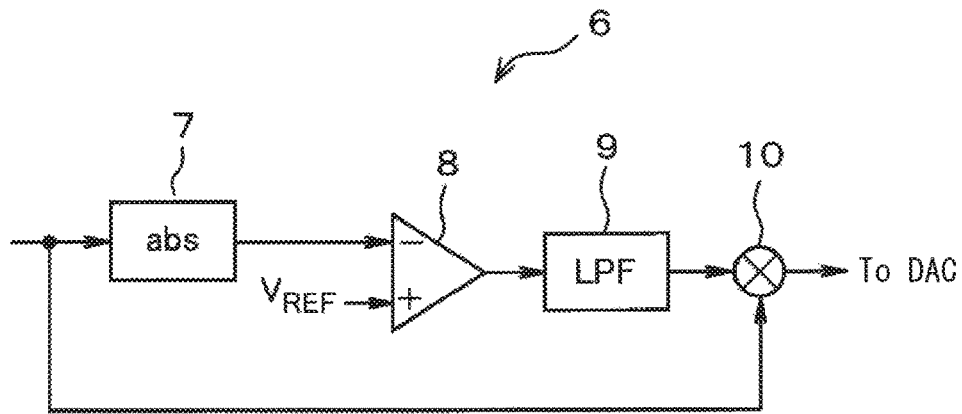
FIG. 2 is a functional block diagram showing a configuration of an AGC circuit.
Figure 3:
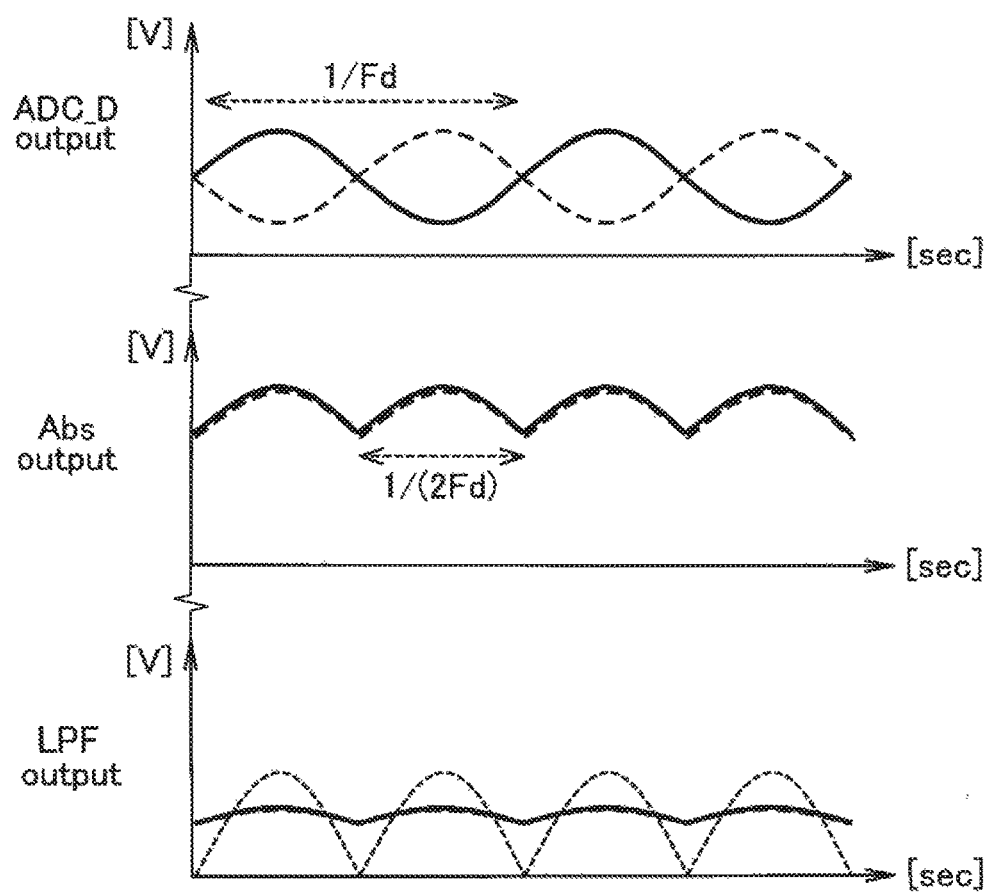
FIG. 3 is a waveform chart showing an operation of the AGC circuit.

As shown in FIG. 2, the AGC circuit 6 that is a lock state determination unit includes an absolute value calculator indicated as an abs circuit 7, a comparator 8, a low pass filter indicated as LPF 9 and a multiplier 10. As shown in FIG. 3, when a drive axis signal of a resonance frequency Fd of the resonator 2 is input, the AGC circuit 6 takes its absolute value by the abs circuit 7. The comparator 8 compares an output absolute value with a reference voltage VREF, and then the LPF 9 smoothes an output signal of the comparator 8. This result is multiplied by the input signal, that is, the drive axis signal, by the multiplier 10 to maintain an amplitude of the drive axis signal at a constant value. Output data of the AGC circuit 6 is converted into an analog signal by a D/A converter DAC 11 and input to the input terminal Drive In of the resonator 2 via a driver 12. The above configuration forms an oscillation loop of a drive axis. The resonance frequency Fd is, for example, about 10 kHz to 20 kHz.

Figure 4:
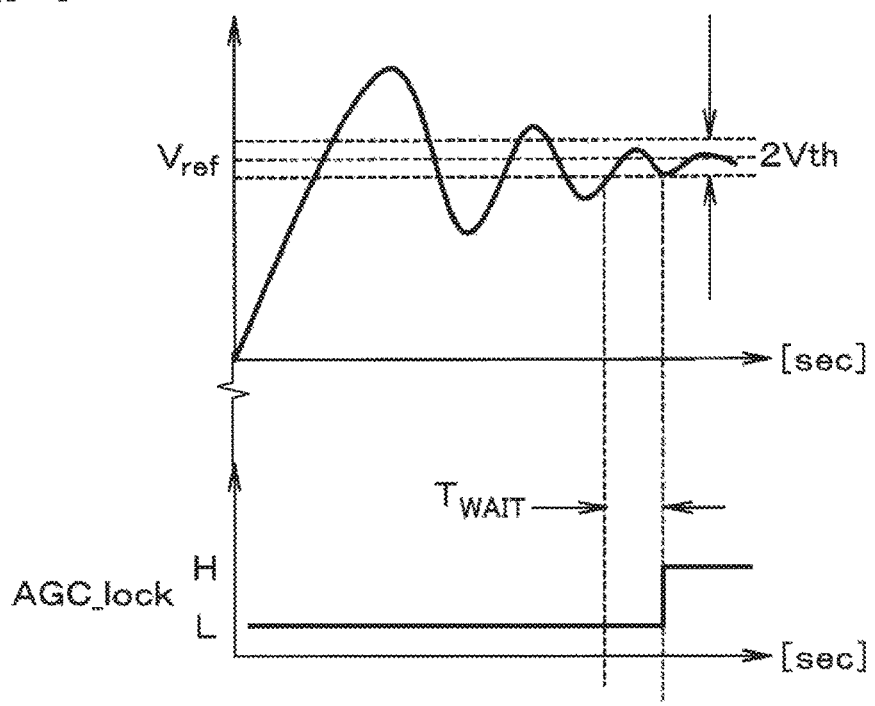
FIG. 4 is a timing chart showing the operation of the AGC circuit.

Further, as shown in FIG. 4, when the gyroscope 1 is activated, the AGC circuit 6 monitors whether an output level of the TIA 3 has converged within a range of ±Vth relative to a center level, that is, the reference voltage VREF. When the state of convergence within the above range continues for a predetermined time period TWAIT or longer, a lock signal AGC_lock is activated to a high level H. In order to improve the accuracy of phase control described later, it is important that the amplitude of the drive axis signal is constant. If a set value Vth is made small and the predetermined time period TWAIT is made long, a phase correction accuracy is improved. However, there is a trade-off that the time period required for the correction becomes long.

Output data of the HPF 5 has its phase shifted by 90° by a Hilbert conversion circuit 13, which is a phase shifter, and a Q signal which is a quadrature signal is generated. Further, the output data becomes an in-phase signal, that is, I signal, via a first delay circuit indicated as a Dly1 circuit 14, which gives a delay time equal to a signal propagation delay time of the Hilbert conversion circuit 13. The I signal and the Q signal are input to a phase compensator indicated as a PI (phase interpolator) circuit 15. The PI circuit 15 generates a signal S2 having an arbitrary phase based on the input I signal and Q signal and according to the applied control signal.

On the other hand, a modulated sense axis signal output from the output terminal Sense Out of the resonator 2 becomes a signal S1 via a charge amplifier indicated as CA 16, an ADC_S 17, HPF 18 and a Dly1 circuit 19 in the similar manner as the drive axis signal, and is input to a multiplier 20. The Dly1 circuit 19 gives the same delay time as the Dly1 circuit 14. The multiplier 20 outputs a signal S3 obtained by multiplying the signal S1 by the signal S2 to a first low-lass filter indicated as LPF1 21 and a second low-pass filter indicated as LPF2 22.

The LPF2 22 outputs an angular velocity signal Rate, which is a demodulated sense signal of the gyroscope 1, to an outside. A cutoff frequency of the LPF2 22 is set higher than that of the LPF1 21. The LPF1 21 corresponds to a control low-pass filter, and the LPF2 22 corresponds to an output low-pass filter.

Output data of the LPF1 21 is input to a sample hold circuit indicated as an S/H circuit 25 via a first multiplexer 23, a PI controller indicated as a PIC circuit 24, which performs proportional and integral calculation. Zero data is given to the other input terminal of the multiplexer 23. An output terminal of the S/H circuit 25 is connected to a write bus of an EPROM 26, which is a memory, and is also connected to a control terminal of the PI circuit 15 via a second multiplexer 28. The other input terminal of the multiplexer 28 is connected to a read bus of the EPROM 26.

The lock signal AGC_lock output from the AGC circuit 6 and the output data of the LPF1 21 are input to a control circuit 27 that is a control unit. The control circuit 27 controls input switching of the multiplexers 23 and 27, and also provides a trigger signal for the S/H circuit 25 to sample input data.

Figure 9:
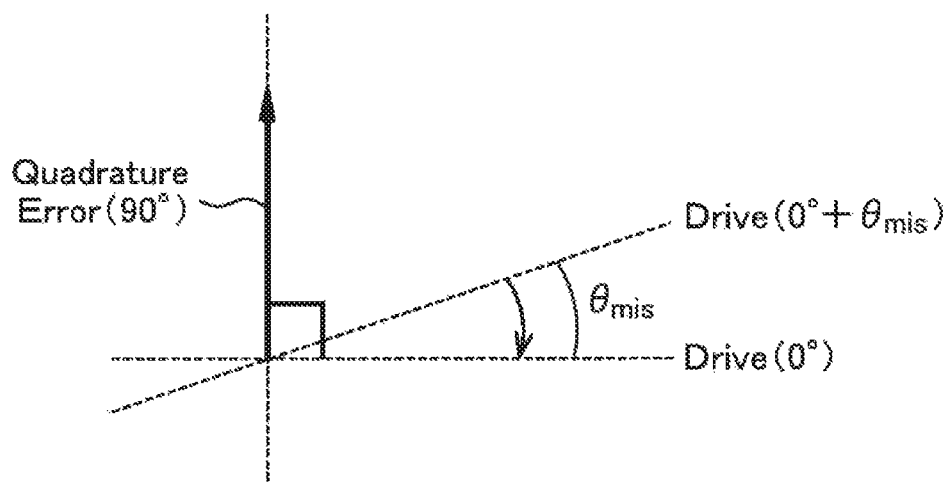
FIG. 9 is a diagram for explaining an influence of a phase error on a drive axis signal.

The circuit including the multiplier 20 to the PI circuit 15 described above has a configuration in which a negative feedback is applied so that the output of the LPF1 21 becomes zero. Therefore, in the present embodiment, a phase of the quadrature error signal output from the sense axis and the drive axis signal is calculated by synchronous detection in the multiplier 20 and then the phase control is performed by applying the negative feedback so that the output becomes zero, when the gyroscope 1 is in a stationary state in which the angular velocity from the outside does not act. As a result, as shown in FIG. 9, the quadrature error $\theta$mis is canceled and the PI circuit 15 gives a phase in which the drive axis signal matches the drive axis, I axis, having a phase of 0°.

For example, by performing the above phase control in a final shipping test of the gyroscope 1, the output result of the PIC circuit 24 at the time when the output of the LPF1 21 becomes close to zero is sampled and held, and its result is written in the EPROM 26. When the gyroscope 1 is normally operated, the multiplexer 28 is switched to the read bus side of the EPROM 26 and the PI circuit 15 is controlled by the read data. Thus, optimal phase correction will be performed without needing the feedback operation performed during the test.

Figure 5:
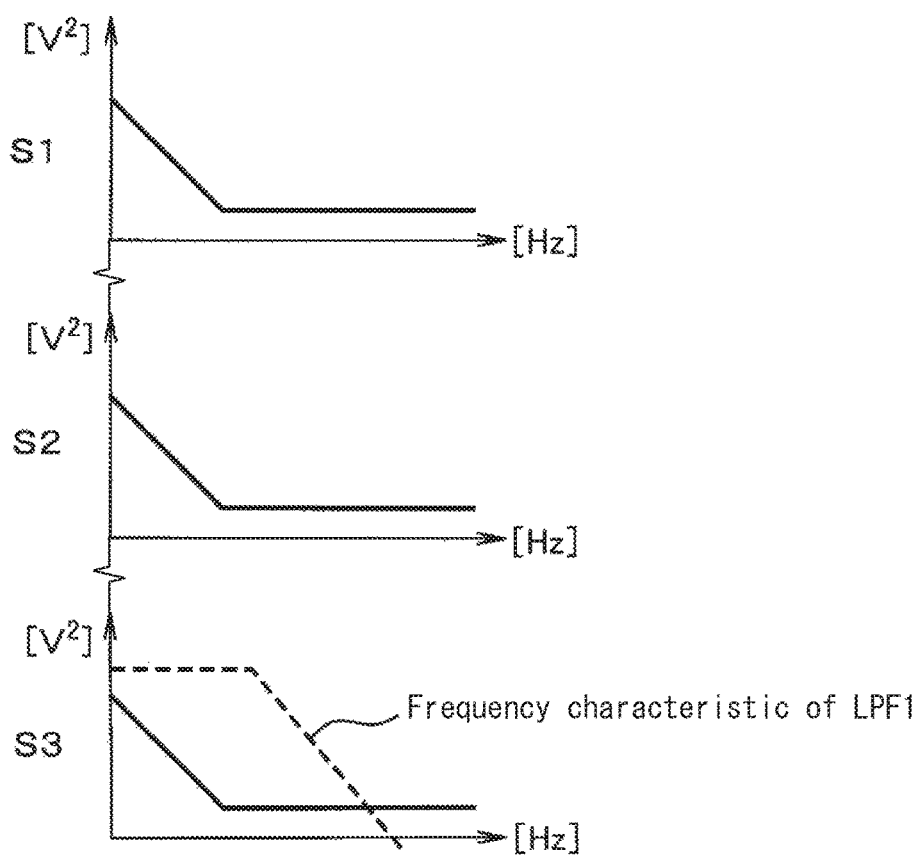
FIG. 5 is a diagram for explaining an operation of an HPF.

Here, the HPFs 5 and 18 remove flicker noise and low frequency noise arising from a DC offset. The low frequency noise included in the drive axis signal and the sense axis signal is converted to a low frequency near the zero frequency when synchronously detected in the multiplier 20, and hence a phase lock accuracy is reduced. As shown in FIG. 5, this low frequency noise cannot be removed by the LPF 12. Therefore, the low frequency noise components are removed by the HPFs 5 and 18 at a stage which is immediately following after A/D conversion to improve the phase lock accuracy.

Figure 6:
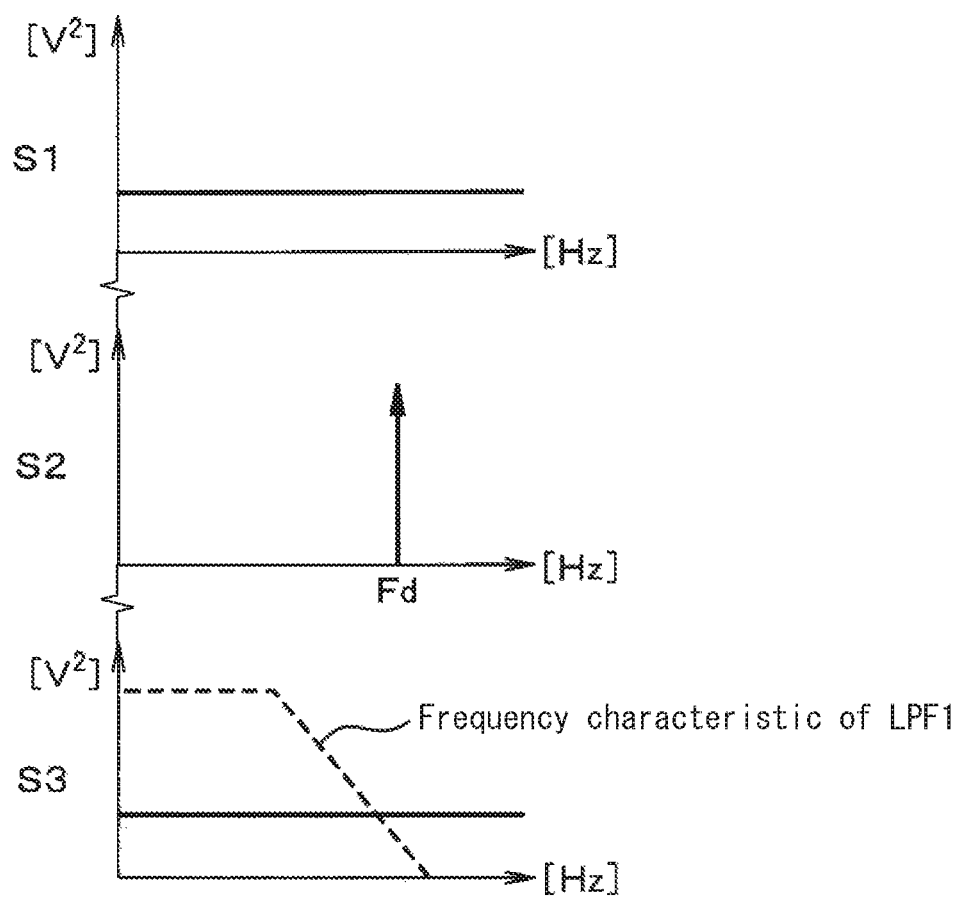
FIG. 6 is a diagram for explaining an operation of an LPF.

The LPF1 21 removes thermal noise. The signal S2 from the PI circuit 15 contains components of a drive axis resonance frequency Fd, and the signal S1 contains thermal noise. Therefore, as shown in FIG. 6, the thermal noise also propagates at the output of the multiplier 20. In order to remove this noise and realize highly accurate phase correction, it is desirable to set the cutoff frequency of the LPF1 21 sufficiently low. On the other hand, the LPF2 22 that outputs the angular velocity signal Rate to the outside determines a bandwidth of the gyroscope 1. Therefore, in order to realize a wide band gyroscope while performing highly accurate phase correction, a cutoff frequency of the LPF2 22 is desirably set higher than that of the LPF1 21. However, without being limited to such a setting, the LPF2 22 may be removed and the angular velocity signal Rate may be output to the outside from the LPF1 21.

As described above, in order to improve the phase lock accuracy, it is desirable that the LPF1 21 has a low cutoff frequency and a high order configuration. However, this becomes a factor that reduces a phase margin. In order to secure a phase margin of 45° or more, the PIC circuit 24 is configured by a filter having a transfer characteristic (KP+KI/s).

Figure 7:
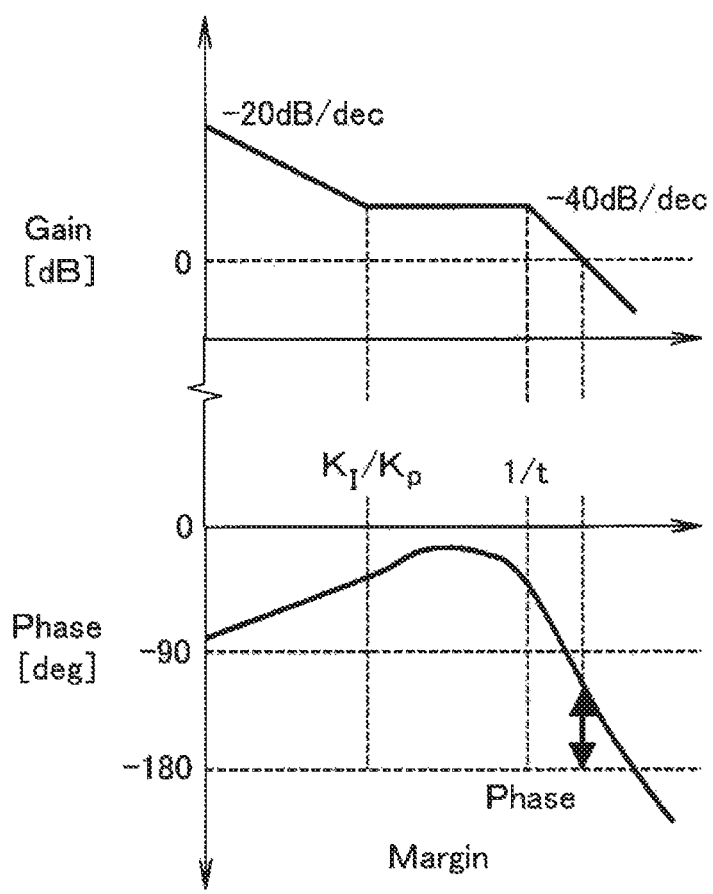
FIG. 7 is a diagram showing a gain characteristic and a phase characteristic of the LPF.

In this case, the phase margin can be secured appropriately by setting a zero point frequency KI/KP to be lower than the cutoff frequency LPF1 21. For example, FIG. 7 shows an open loop gain of the phase correction loop in case the LPF1 21 is configured by a second order of a time constant T. Thus, it is possible to realize a phase correction loop that removes thermal noise by a low cutoff frequency of the LPF1 21 to increase an S/N ratio and does not impair stability. Moreover, the DC gain is increased by the generation of a pole in DC, and the phase correction accuracy can be improved. The entire gyroscope 1 is configured by, for example, an ASIC (application specific integrated circuit).

Figure 8:
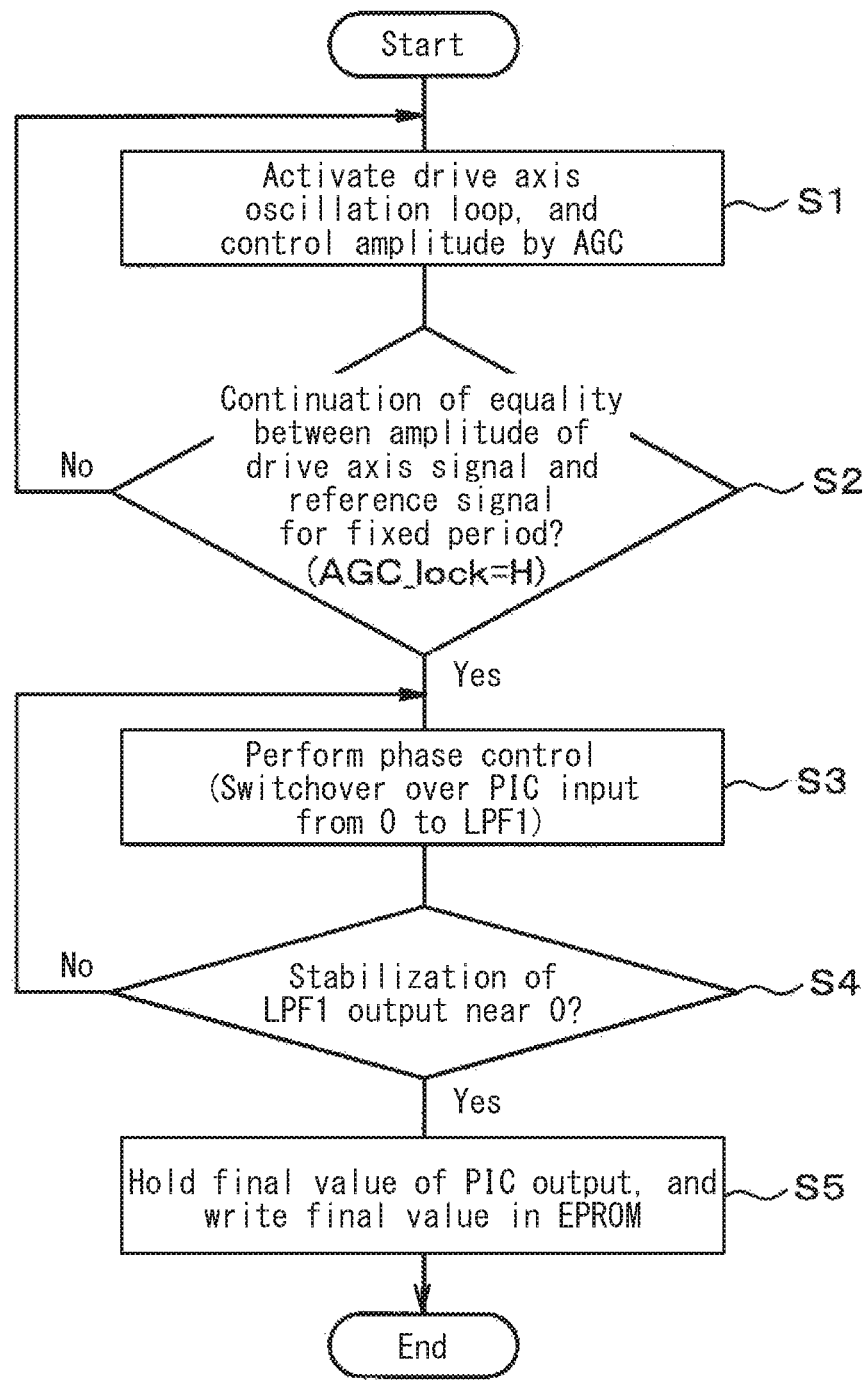
FIG. 8 is a flowchart mainly showing an operation of a control circuit.

Next, an operation of the present embodiment will be described. FIG. 8 shows processing to be performed with the gyroscope 1 being placed in a stationary state in which the angular velocity from the outside does not act. In the initial state, the zero data side is selected as the input of the multiplexer 23. First, electric power is supplied to the gyroscope 1 to activate the drive axis oscillation loop. The AGC circuit 6 controls the amplitude of the loop (S1). Then, the control circuit 27 checks whether the lock signal AGC_lock input from the AGC circuit 6 becomes active, that is, H level (S2).

When the lock signal AGC_lock becomes active (Yes), the control circuit 27 switches the input of the multiplexer 23 to the LPF1 21 side and starts phase control (S3). When it is determined that the output level of the LPF1 21 is stabilized near zero (S4; Yes), a trigger signal is output to the S/H circuit 25 and the output data of the PIC circuit 24 at that time, that is, the final value, is held. Then, the final value is written and stored in the EPROM 26 (S5).

As described above, according to the present embodiment, the gyroscope 1 is configured by the resonator 2 of the MEMS structure that is provided with the input terminal Drive In, the output terminal Drive Out, and the output terminal Sense Out. The AGC circuit 6 is arranged in the path between the output terminal Drive Out to the input terminal Drive In. The AGC circuit 6 stabilizes the amplitude of the drive axis signal to the level equivalent to the reference voltage VREF when it is activated, and outputs the lock signal AGC_lock when the fluctuation of the amplitude is determined to be stabilized.

The Hilbert converter 13 generates the quadrature signal by shifting the drive axis signal by 90°. The PI circuit 15 outputs the phase signal having a phase corresponding to the control signal based on the in-phase signal I and the quadrature signal Q of the drive axis signal. The multiplier 20 multiplies the sense axis signal S1 by the phase signal S2 output from the PI circuit 15. The LPF1 21 filters the multiplication signal S3 and demodulates the sense signal Rate.

The control circuit 27 controls the multiplexer 23, inputs the zero level signal to the PIC circuit 24 in the initial state. When the AGC circuit 6 outputs the lock signal AGC_lock, the control circuit 27 inputs the output signal of the LPF1 21 to the PIC circuit 24 and starts the phase control. When it is determined that the output signal is stabilized near zero level, the control circuit 27 finishes the phase control, and writes the control signal output from the PIC circuit 24 at that time in the EPROM 26 to be stored therein.

Thus, when performing normal sensing by the gyroscope 1, the control circuit 27 controls the second multiplexer 28 to input the data of the control signal stored in the EPROM 26 to the PI circuit 15. Thus, an optimum phase compensation is performed so as to cancel the quadrature error θmis as shown in FIG. 9. Further, since the output LPF2 22 having the cutoff frequency set higher than that of the LPF1 21 is provided, the bandwidth of the gyroscope 1 can be set wide without being restricted by the cutoff frequency of the LPF1 21.

Second Embodiment

Hereinafter, the identical parts as those in the first embodiment will be designated by the same reference numerals for simplification of the description. Only differences from the first embodiment will be described.

Figure 10:
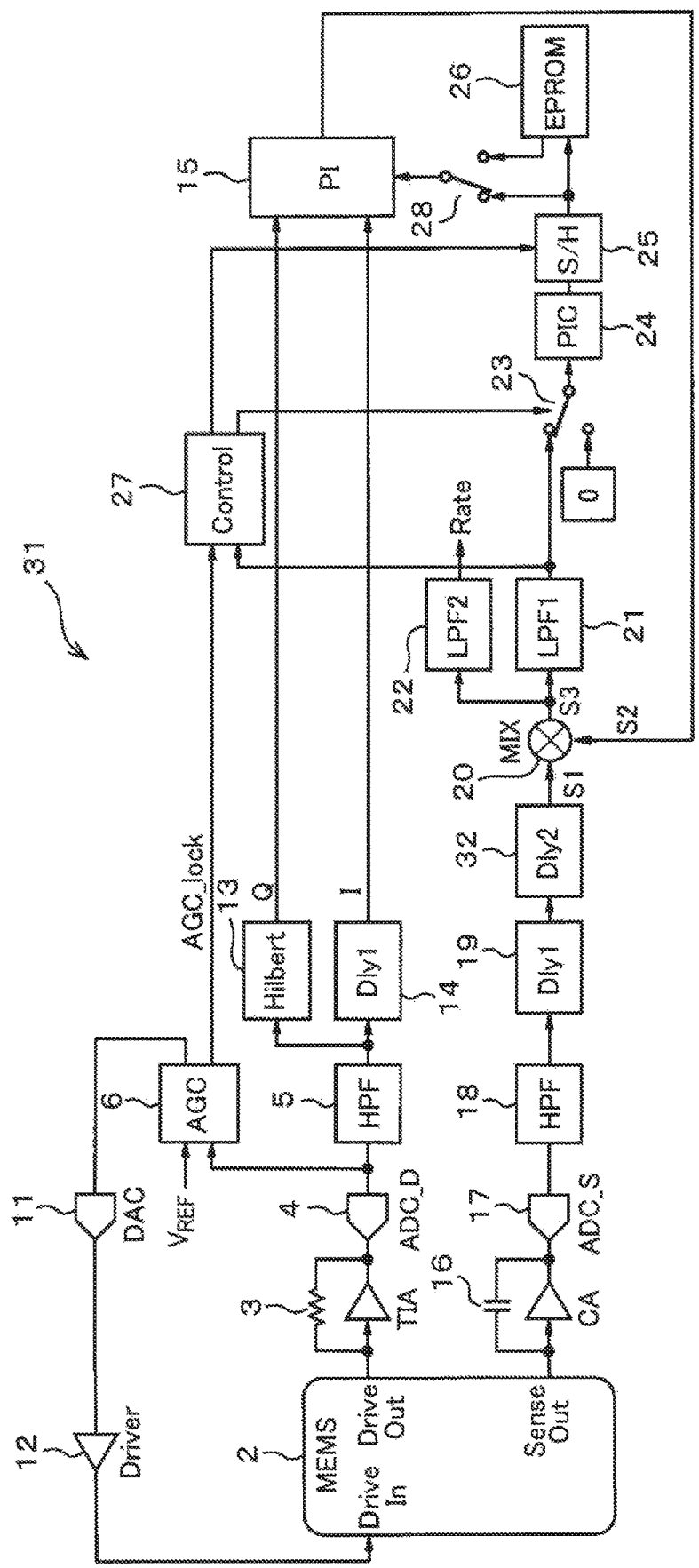
FIG. 10 is a functional block diagram showing a configuration of a vibration type gyroscope according to a second embodiment.

As shown in FIG. 10, a gyroscope 31 of the second embodiment has a configuration in which a second delay circuit indicated as Dly2 32 is inserted between the first delay circuit Dly1 19 and the multiplier 20. A delay time provided by the second delay circuit Dly2 32 is set equal to a signal propagation delay time in the path from a point where the I and Q signals are input to the PI circuit 15 and a point where the phase signal S2 is input to the multiplier 20.

As a result, the delay amounts of the sense axis signal S1 and the phase signal S2 input to the multiplier 20 become equal, so that the PI circuit 15 only needs to correct the phase difference generated in the analog region. Since the amount of delay generated in an analog circuit such as MEMS due to temperature characteristics, manufacturing error, etc. is predictable, the phase correction range can be limited. As a result, the value range of the data output from the multiplier 20 can be limited, so that it is possible to increase the accuracy of the gyroscope 31 by allocating a larger bit length to the decimal part in a constant bit width.

Third Embodiment

Figure 11:
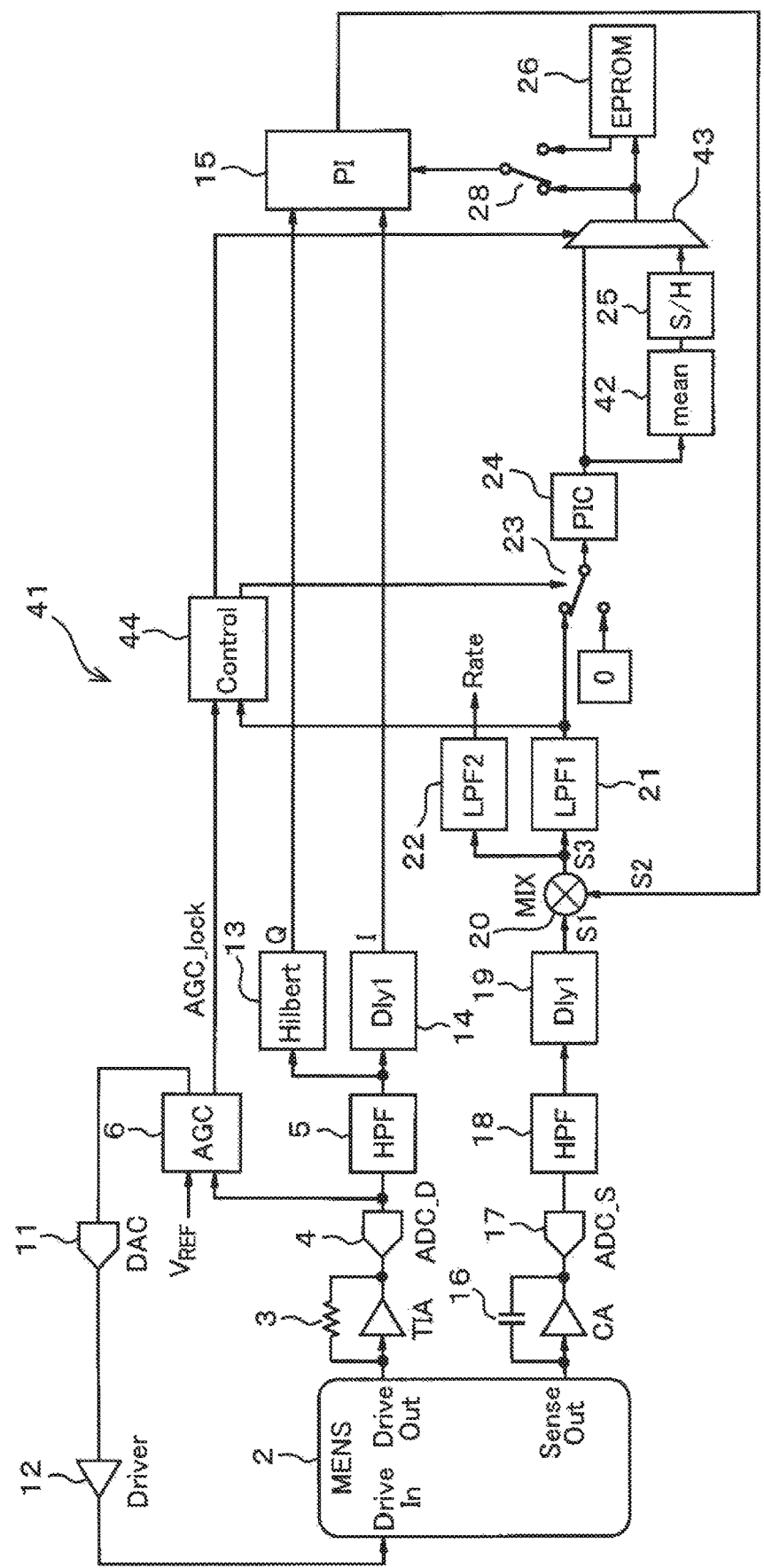
FIG. 11 is a functional block diagram showing a configuration of a vibration type gyroscope according to a third embodiment.

In a gyroscope 41 of a third embodiment shown in FIG. 11, a moving average circuit, that is, a mean circuit 42, is provided between the PIC circuit 24 and the S/H circuit 25. Further, a third multiplexer 43 is provided between the S/H circuit 25 and the EPROM 26, and the output data of the PIC circuit 24 is directly input to the other input terminal of the multiplexer 43. The control circuit 44 also controls switching of the multiplexer 43.

Figure 12:
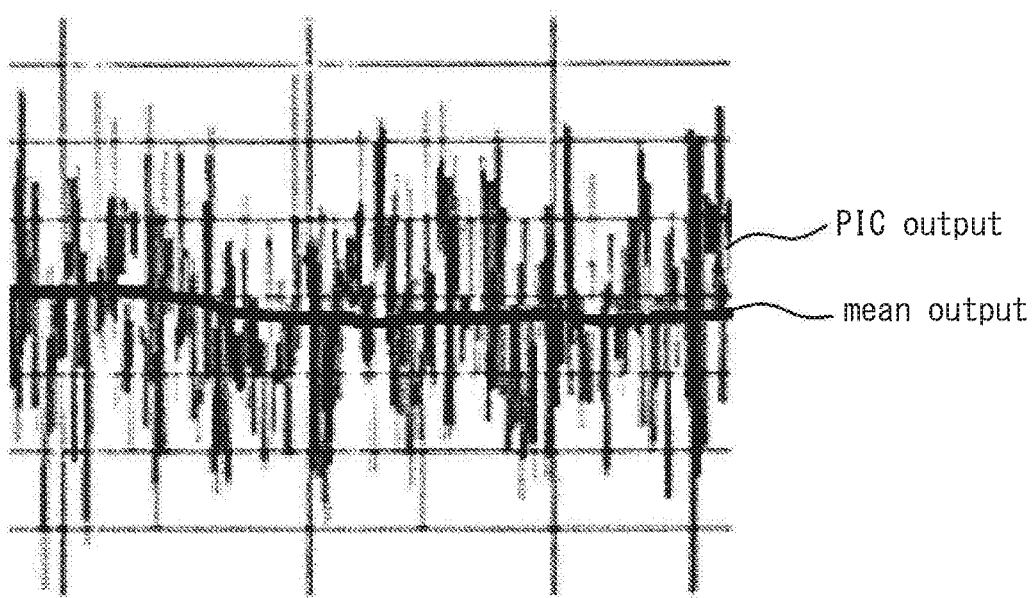
FIG. 12 is a waveform chart showing an operation of a mean circuit.

Next, operation of the third embodiment will be described. The cutoff frequency of the LPF1 21 is not always set to a low value because it is restricted by the stability of the control loop and a convergence time. In such a case, the thermal noise cannot be reduced sufficiently, and the S/N ratio of the signal output from the PIC circuit 24 decreases. Therefore, in the third embodiment, by incorporating the mean circuit 42 in the phase control loop, thermal noise is reduced as shown in FIG. 12.

However, simply incorporating the mean circuit 42 will cause a problem that the phase control loop becomes unstable because a delay of the mean circuit is large. Therefore, the mean circuit 42 concurrently calculates the moving average of the output, while the multiplexer 43 uses the output of the PIC circuit 24 during a period that the phase control loop is operating. Then, by switching to the output of the mean circuit 42 at the end of the phase control, the PI control voltage from which noise has been removed is provided. With this configuration, both stability of the control loop and high S/N ratio can be achieved, and highly reliable phase correction can be performed.

Fourth Embodiment

Figure 13:
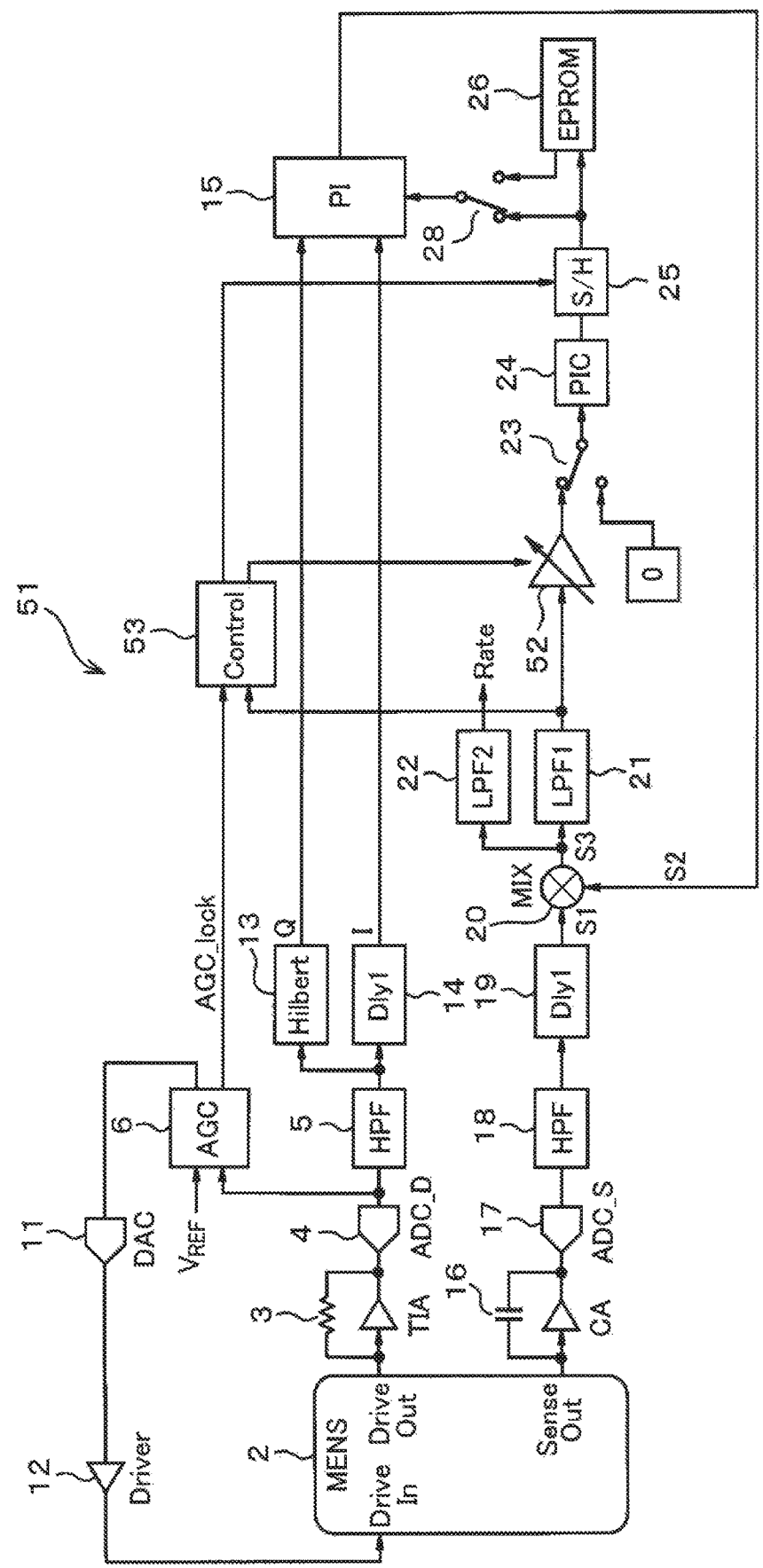
FIG. 13 is a functional block diagram showing a configuration of a vibration type gyroscope according to a fourth embodiment.

A gyroscope 51 of a fourth embodiment shown in FIG. 13 has a variable gain amplifier 52 provided between the LPF1 21 and the multiplexer 23. The control circuit 53 controls a gain of the variable gain amplifier 52. If the cutoff frequency of the LPF1 21 is lowered to reduce noise, the bandwidth of the phase correction loop is reduced, and it takes a long time to converge.

Figure 14:
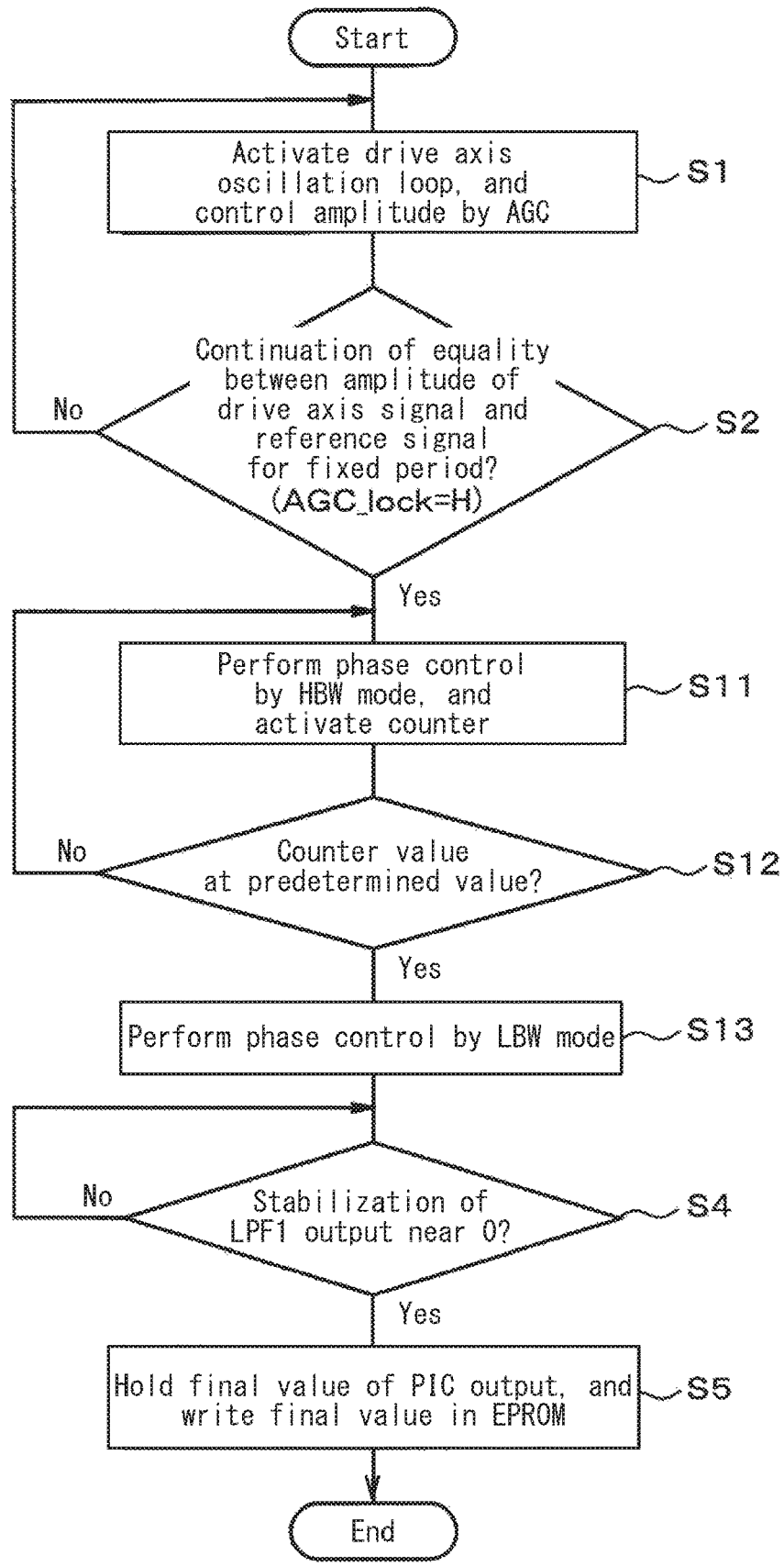
FIG. 14 is a flowchart mainly showing an operation of a control circuit.

Therefore, as shown in FIG. 14, when a control circuit 53 determines "Yes" in step S2, the gain of the amplifier 52 is set to a value larger than "1" for a fixed period of time counted by a counter after the start of phase control thereby to set a high band width mode, that is, HBW mode (S11). As a result, the bandwidth of the phase correction loop is increased, and the phase correction loop is converged early.

However, in the HBW mode, noise is also amplified, so that the convergence accuracy of the phase correction loop is reduced. Therefore, after operating in the HBW mode for a fixed time period (S12; Yes), the mode is switched to the LBW mode which sets the gain of the amplifier 52 to "1" (S13). In that state, the phase correction loop operation is finished after waiting for a fixed time period of convergence in step S4.

As described above, according to the fourth embodiment, it is possible to reduce the time period required for the final shipping test of the gyroscope 51 and to reduce cost.

Fifth Embodiment

Figure 15:
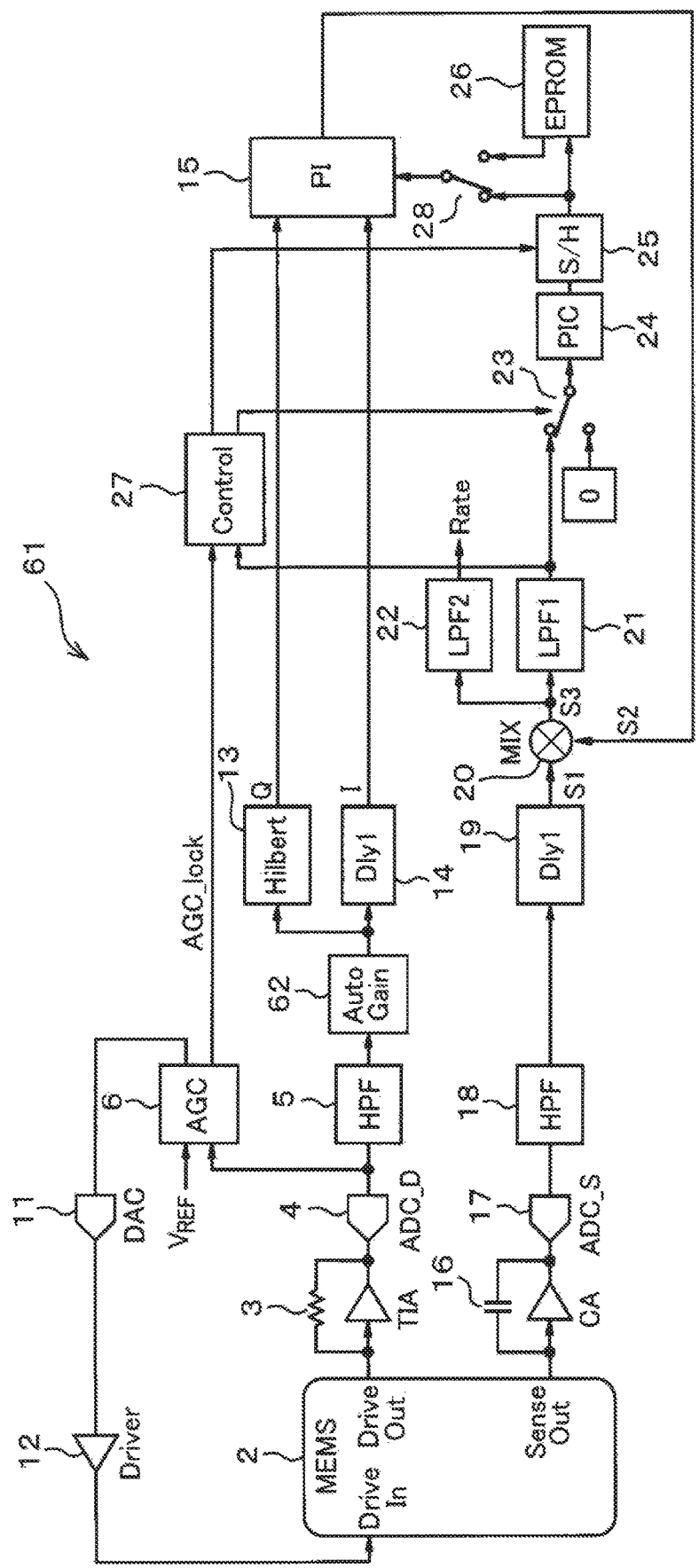
FIG. 15 is a functional block diagram showing a configuration of a vibration type gyroscope according to a fifth embodiment.

A gyroscope 61 of a fifth embodiment shown in FIG. 15 includes an auto gain circuit 62, which corresponds to a high frequency amplitude fluctuation suppression circuit, between the HPF 5 and the delay circuit 14. As described in the first embodiment, the AGC circuit 6 has a function of keeping the amplitude of the drive axis signal constant, but cannot smooth high frequency fluctuation components.

As shown in FIG. 3, the LPF 9 forming the AGC circuit 6 need to sufficiently lower a cutoff frequency to be smaller than 2 Fd, for example, to about 2 Fd/100, in order to suppress the double value 2 Fd of the resonance frequency. Since this defines the bandwidth of the AGC circuit 6, fluctuation components of a frequency higher than the cutoff frequency cannot be suppressed. Therefore, in the drive axis, the noise due to the high frequency components that are not removed by the HPF 5 reaches the multiplier 20 via the PI circuit 15 and deteriorates the phase correction accuracy.

Figure 16:
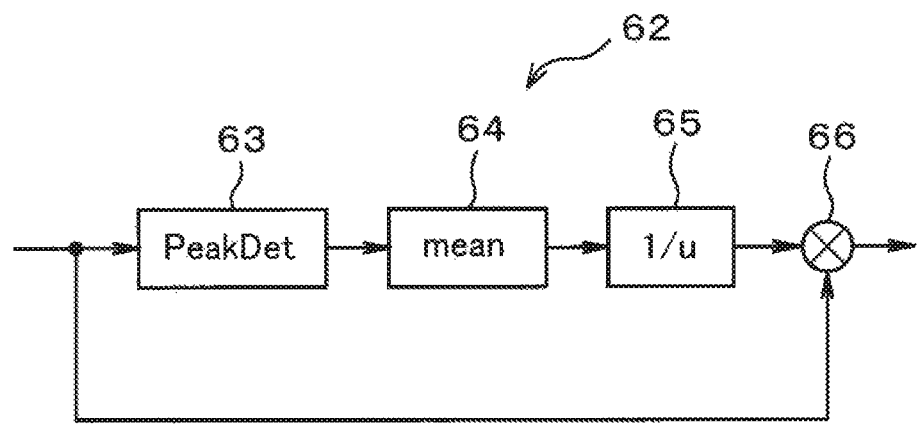
FIG. 16 is a functional block diagram showing a configuration of an auto gain circuit.
Figure 17:
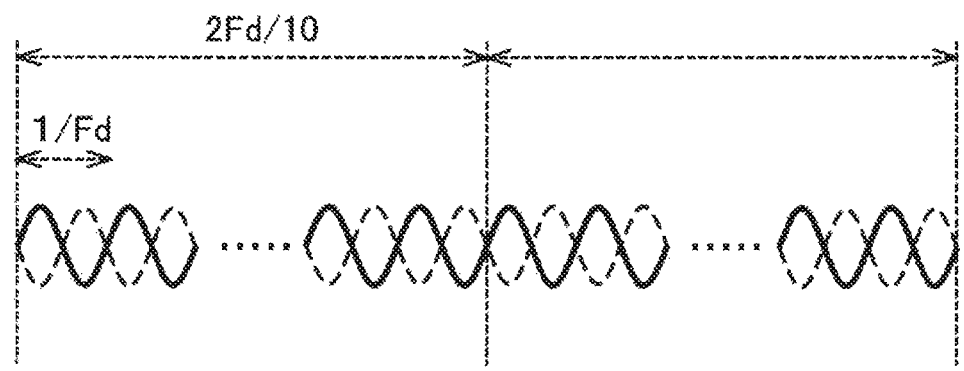
FIG. 17 is a waveform chart explaining an operation of the auto gain circuit.

Therefore, the auto gain circuit 62 suppresses the high frequency fluctuation components included in the drive axis signal. As shown in FIG. 16, the auto gain circuit 62 includes a peak detector circuit 63, a mean circuit 64, a reciprocal arithmetic circuit 65, and a multiplier 66. The peak detector circuit 63 detects a peak-to-peak value of the input signal amplitude. The mean circuit 64 calculates, as shown in FIG. 17, an average value of the peak-to-peak value at a cycle of 2 Fd/10 [Hz] that is 10 times of 2 Fd/100 [Hz], to suppress frequencies higher than 2 Fd/100 [Hz] that cannot be suppressed by the AGC circuit 6. Finally, the reciprocal arithmetic circuit 65 calculates a reciprocal of the average value, and the multiplier 66 multiplies the input signal by the reciprocal of the average value. Thereby, the amplitude fluctuation at the frequency of 2 Fd/10 [Hz] can be suppressed.

Sixth Embodiment

Figure 18:
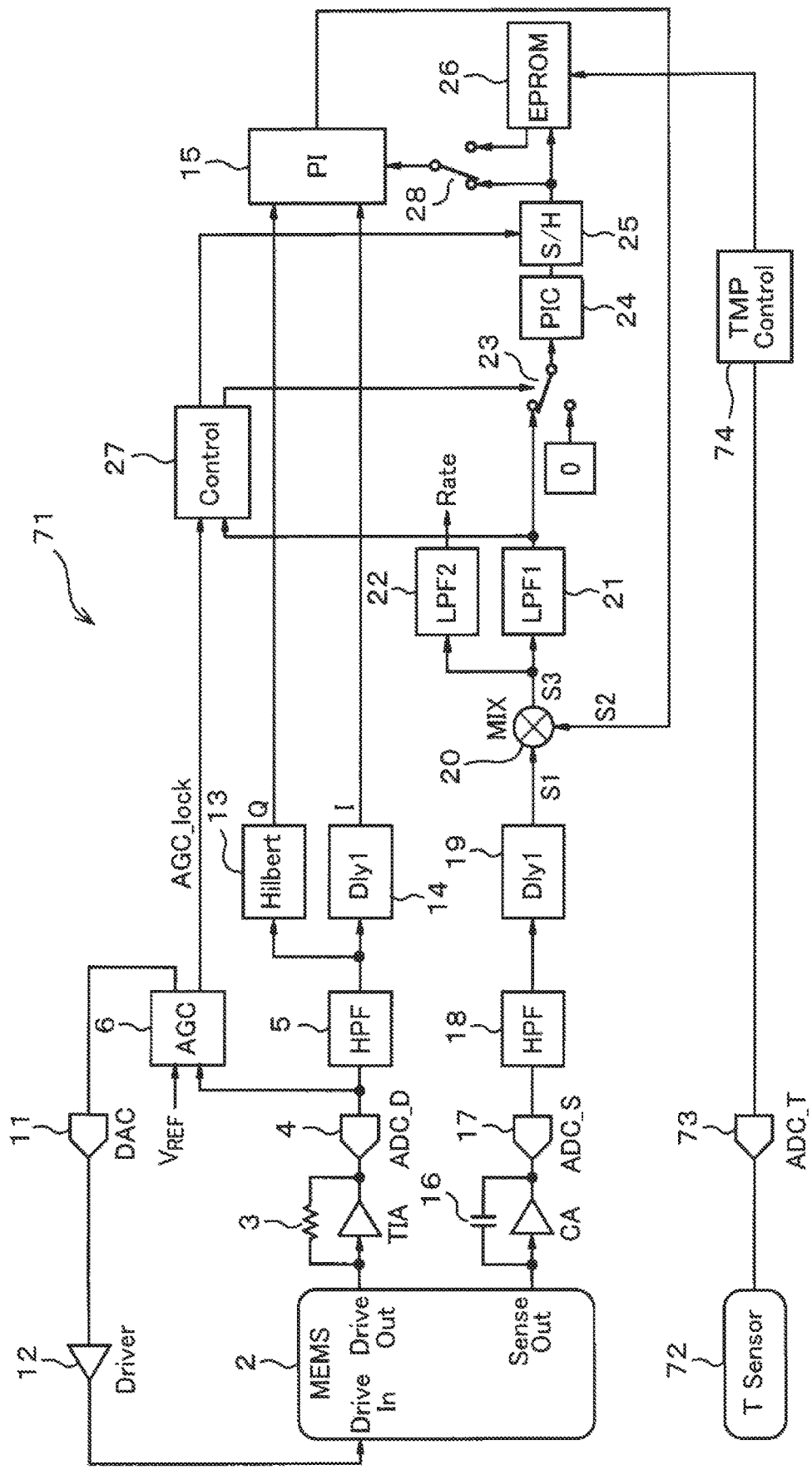
FIG. 18 is a functional block diagram showing a configuration of a vibration type gyroscope according to a sixth embodiment.

A gyroscope 71 of a sixth embodiment shown in FIG. 18 includes a temperature sensor 72, an A/D converter ADC_T 73, and a temperature control circuit 74 corresponding to a temperature compensation control unit. The temperature sensor 72 may be arranged inside the same ASIC as the gyroscope 71 or outside thereof. Since the phase characteristics of the MEMS structure and analog circuits have temperature dependence, the phase difference between the drive axis and the sense axis has temperature dependence.

Therefore, at the time of the final shipping test, the gyroscope 71 is operated at various temperatures to create a plurality of phase correction value tables in correspondence to temperature conditions, and such phase correction tables are stored in the EPROM 26. Thus it is possible to perform a phase correction having no temperature dependence. That is, the temperature condition for each phase correction value table is also written in the EPROM 26 as a control signal by the temperature control circuit 74.

Seventh Embodiment

Figure 19:
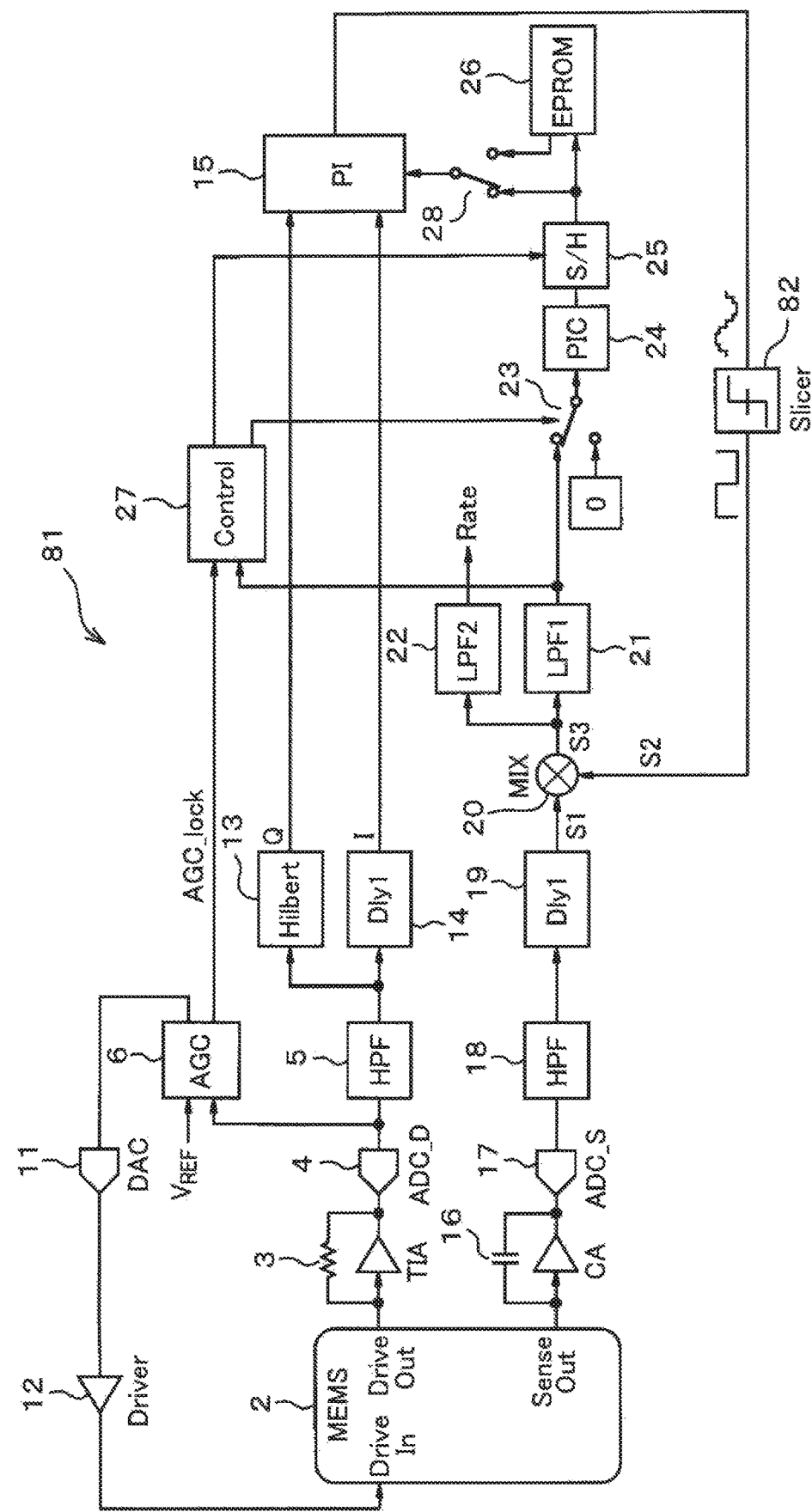
FIG. 19 is a functional block diagram showing a configuration of a vibration type gyroscope according to a seventh embodiment.

A gyroscope 81 according to a seventh embodiment shown in FIG. 19 includes a slicer circuit 82 formed of, for example, a comparator provided between the PI circuit 15 and the multiplier 20. The data output from the PI circuit 15 is a sine wave. The amplitude noise included in the sine wave is a factor that causes noise in the output signal S3 of the multiplier 20. Therefore, the sine wave is converted into a rectangular wave having a binary level "1" or "0" by the slicer circuit 82 to reduce the amplitude noise. Even if it is converted into the rectangular wave, the frequency information of the drive axis signal is not lost, so the phase correction accuracy is not degraded. Further, with this configuration, the circuit scale of the multiplier 20 can be reduced, so that more accurate and low-cost phase correction can be realized.

Eighth Embodiment

Figure 20:
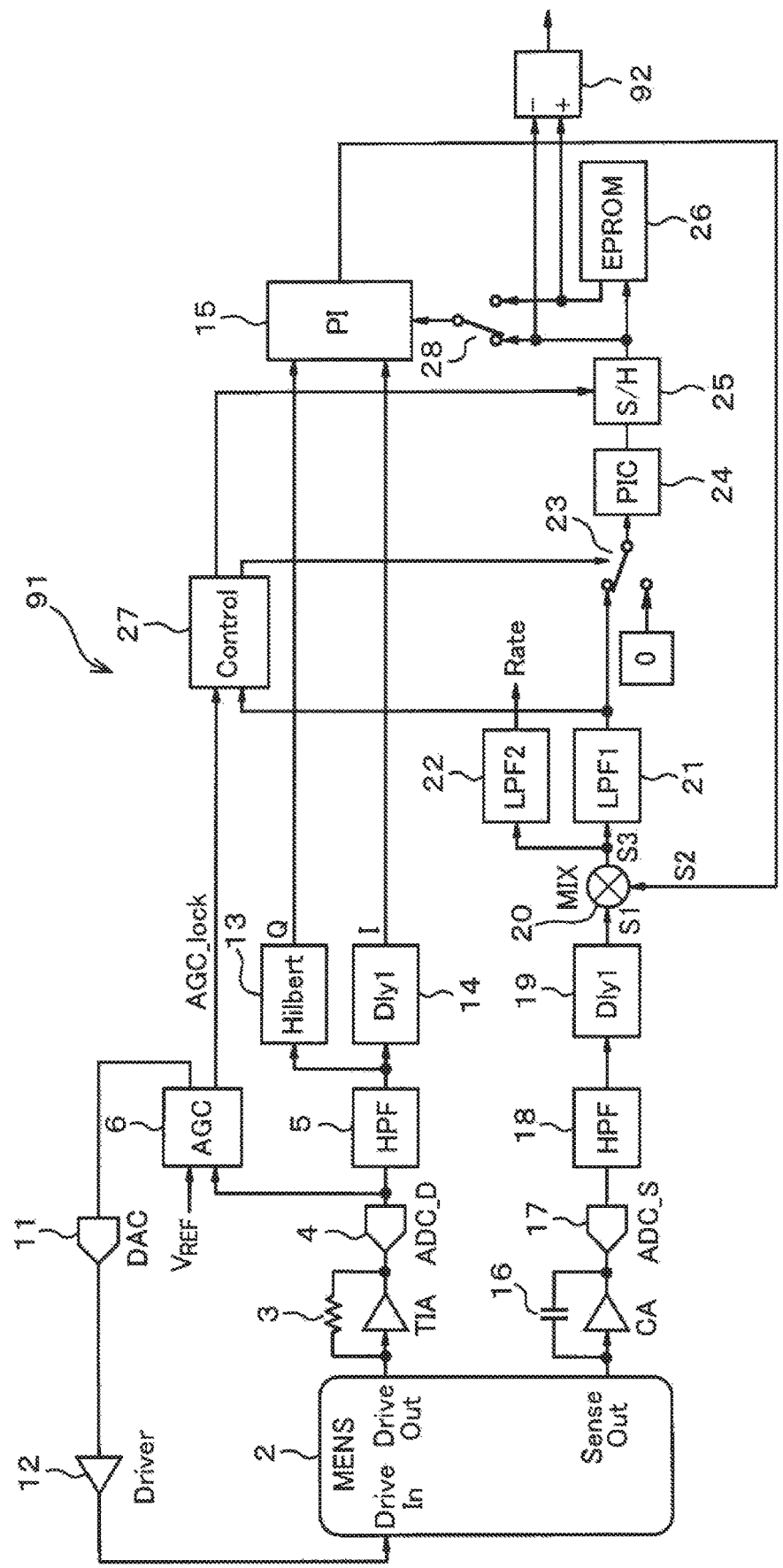
FIG. 20 is a functional block diagram showing a configuration of a vibration type gyroscope in an eighth embodiment.

A gyroscope 91 of an eighth embodiment shown in FIG. 20 includes a self-diagnosis circuit 92 having two input terminals connected to input terminal of the multiplexer 28, respectively. The configurations of the respective embodiments described above assume that the phase control is performed in an environment in which the gyroscope is held stationary when the product is shipped. However, the state of the gyroscope may change from the state at the time of shipment due to deterioration of the MEMS structure or circuit over time, damage in the use environment, or the like.

Therefore, in the eighth embodiment, the gyroscope 91 is provided with a self-diagnosis mode thereby to detect the abnormality by using the self-diagnosis circuit 92 formed of a subtractor. In the self-diagnosis mode, the gyroscope 91 is operated in a stationary state with no angular velocity applied, as in the case of the test before shipping the product. Then, the self-diagnosis circuit 92 compares the table value written in the EPROM 26 at the time of the shipping test and the data output from the PIC circuit 24 at the time of the self-diagnosis mode. When the difference between the compared two data exceeds a determination threshold value, the self-diagnosis circuit 92 detects that an abnormality has occurred in the gyroscope 91 and outputs an abnormality detection signal to the outside.

That is, according to the eighth embodiment, the abnormality of the gyroscope 91 can be detected based on a secular change of the control signal output from the PIC circuit 24.

Ninth Embodiment

According to one conventional publication, Y. Zhao et al, "Effect of stress on split mode gyroscope bias: An experimental study," in Proc. Int. Conf. Solid-State Sens. Actuators (TRANSDUCERS), June. 2017, pp. 1041-1044, in-phase noise, that is, in-phase error, occurs in addition to the quadrature error in the output of the sense axis. This error arises because a driving force of the drive axis leaks to the sense axis side due to a gap shape mismatch of an electrostatic MEMS, and is an error in the same phase as the angular velocity signal. If the in-phase error has a strength that is not negligible, the gyroscope of the embodiment will perform incorrect phase correction.

Figure 22:
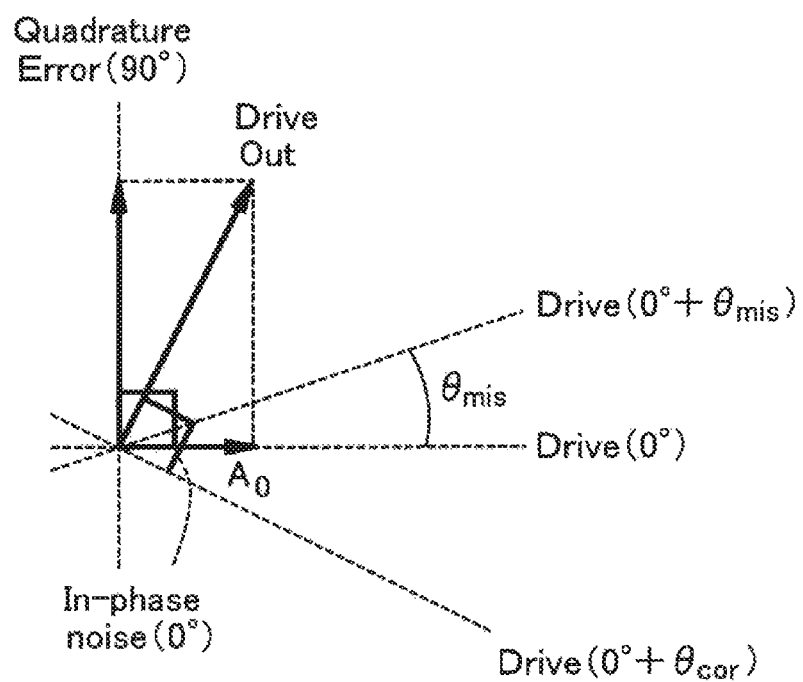
FIG. 22 is a diagram for explaining an in-phase error.

As shown in FIG. 22, in case the signal output from the output terminal Drive Out of the drive axis includes the in-phase error, the error is a sum with the quadrature error and results in Drive Out shown in the Figure. The phase correction of the embodiment controls the phase so as to be orthogonal to this error signal. As a result, the phase of the corrected drive axis signal S2 becomes (0°+θCOR), does not become a signal orthogonal to the quadrature error, and the angular velocity signal Rate remains mixed with the quadrature error. The quadrature error signal has a large amplitude. I the amplitude changes with a change in temperature or package stress, it has a great influence on the output of the sense axis. Therefore, it is desirable to remove the quadrature error from the angular velocity signal as much as possible.

Figure 21:
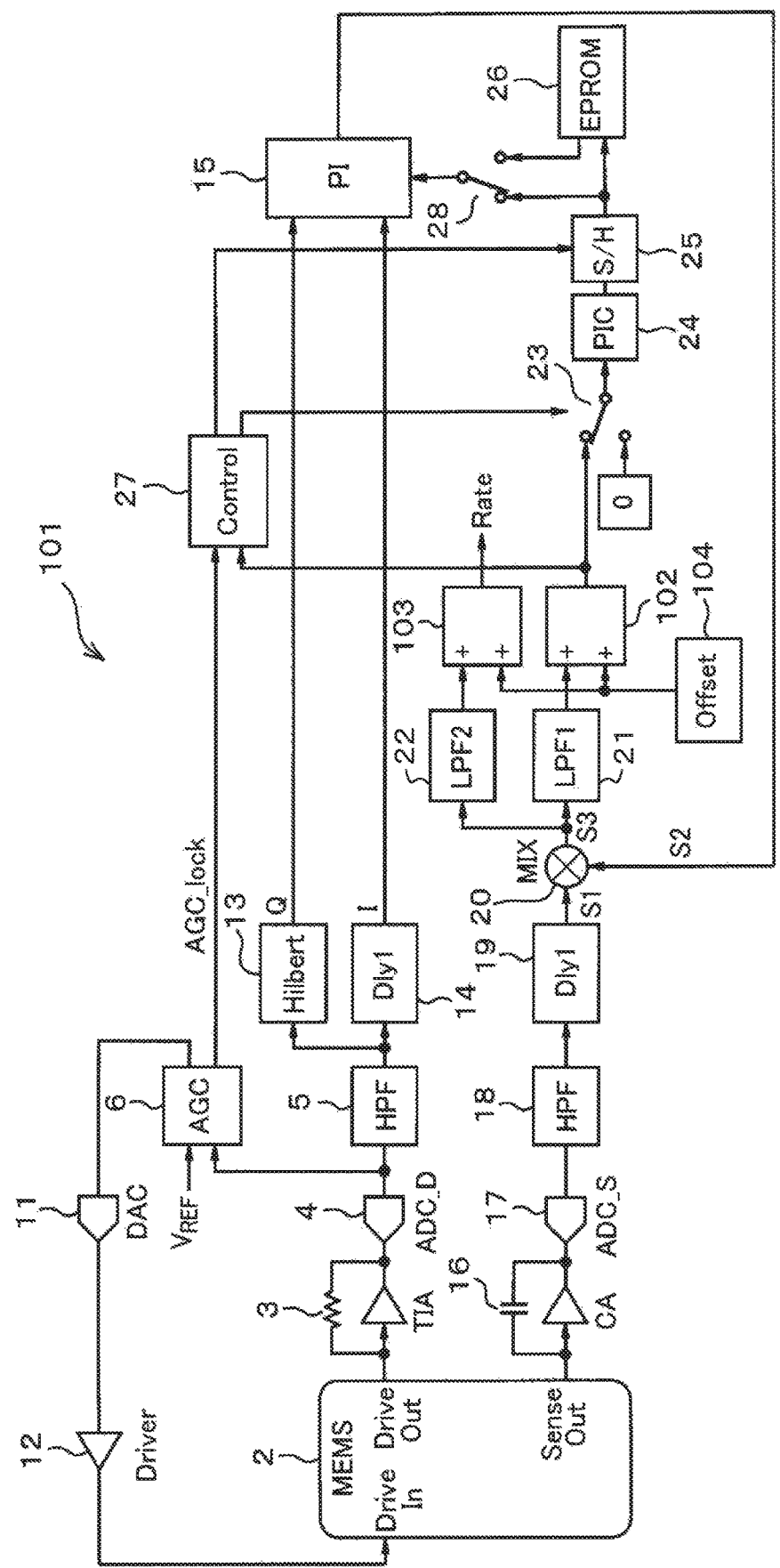
FIG. 21 is a functional block diagram showing a configuration of a vibration type gyroscope according to a ninth embodiment.

In a gyroscope 101 of a ninth embodiment shown in FIG. 21, adders 102 and 103 are arranged on the output sides of the LPFs 21 and 22, and a fixed value corresponding to an amplitude of an in-phase error signal is set in an offset register 104 thereby to remove a common mode error. As shown in FIG. 22, when the amplitude of the in-phase error signal is A0, −A0 is set in the offset register 104.

Since the input value of the PIC circuit 24 is converged to zero in the phase control of the embodiment, the output of the LPF1 21 is converged to +A0. At this time, the phase of the signal S2 becomes Drive (0°), and a signal orthogonal to the quadrature error signal is obtained. Here, the amplitude of the in-phase error may be determined by the theoretical formula described in the above-referred publication of Y. Zhao et al and the simulation of the MEMS structure. It is also possible to actually measure it as described below.

Figure 23:
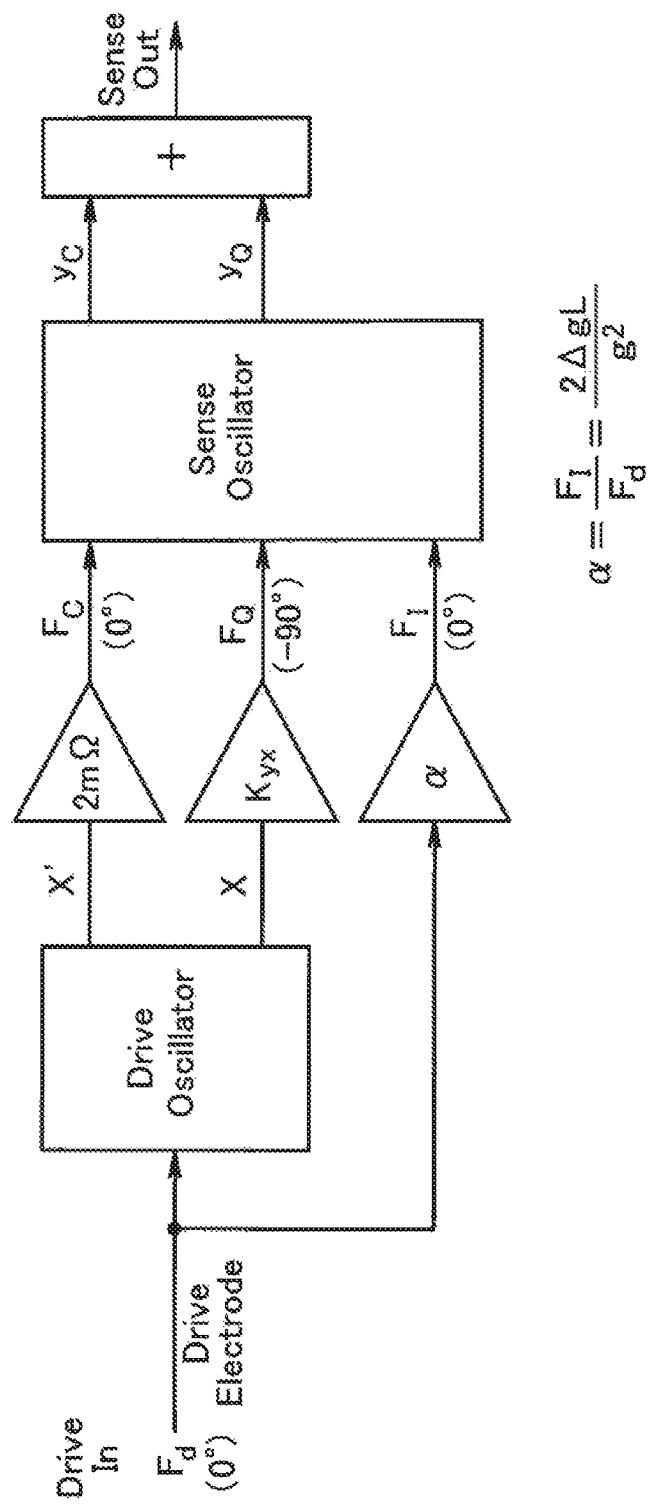
FIG. 23 is a first diagram showing a equalization model of a resonator.
Figure 24:
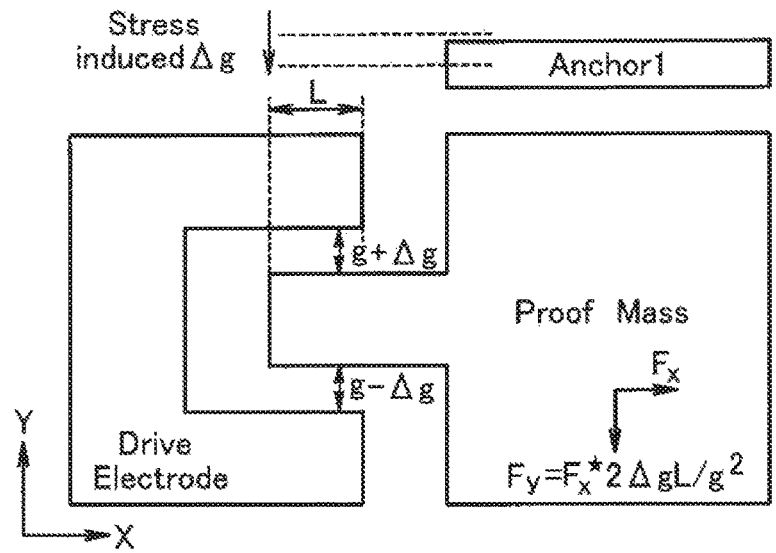
FIG. 24 is a second diagram showing an equalization model of a resonator.

FIG. 23 and FIG. 24 show equalization models from the input terminal Drive In to the output terminal Sense Out of the MEMS resonator 2. The drive axis and the sense axis each have a unique mass-spring-damper system. Here, "m" is a mass, "Q" is an input angular velocity, and "Kyx" is a conversion coefficient for converting the drive axis displacement that causes the quadrature error to the drive force of the sense axis. "α" is a coefficient for transmitting the in-phase error. and the in-phase error propagates to the sense axis side without passing through the mass-spring-damper system of the drive axis.

Figure 25:
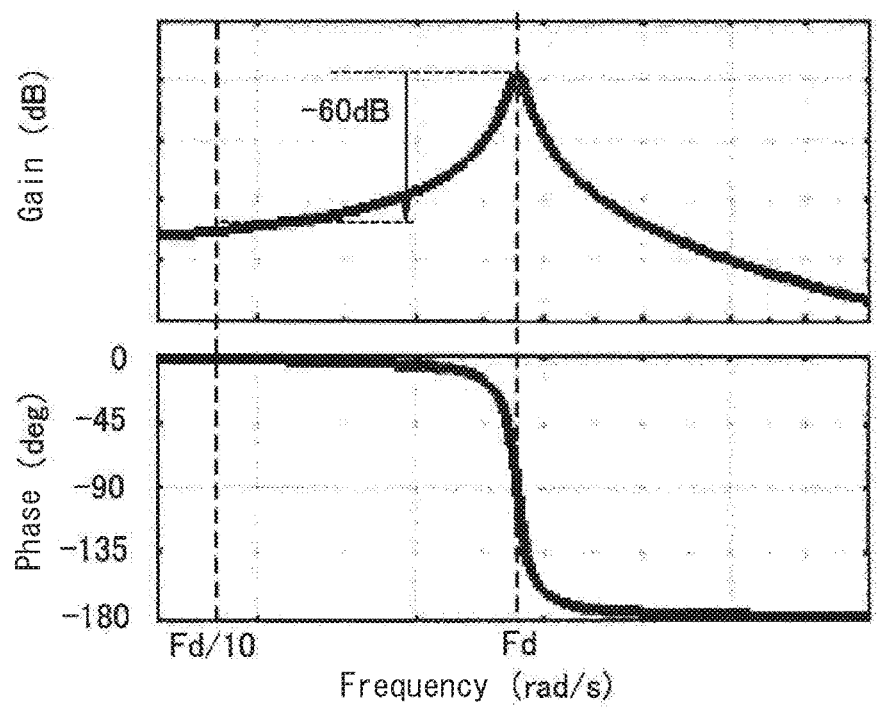
FIG. 25 is a Bode diagram of a resonator.

Further, as shown in FIG. 25, the drive axis has no gain at frequencies other than the resonance frequency. By utilizing this characteristic, the strength of the in-phase error can be measured by inputting the signal of the frequency at which the in phase error is dominant in the output terminal Sense Out to the input terminal Drive In and monitoring the output of the output terminal Sense Out. In the example shown in FIG. 26, a frequency Fd/10, that is −60 dB lower than the gain of the resonance frequency Fd, is selected. It is noted that FIG. 24 is shown in the above-referred publication of Y. Zhao et al.

Figure 26:
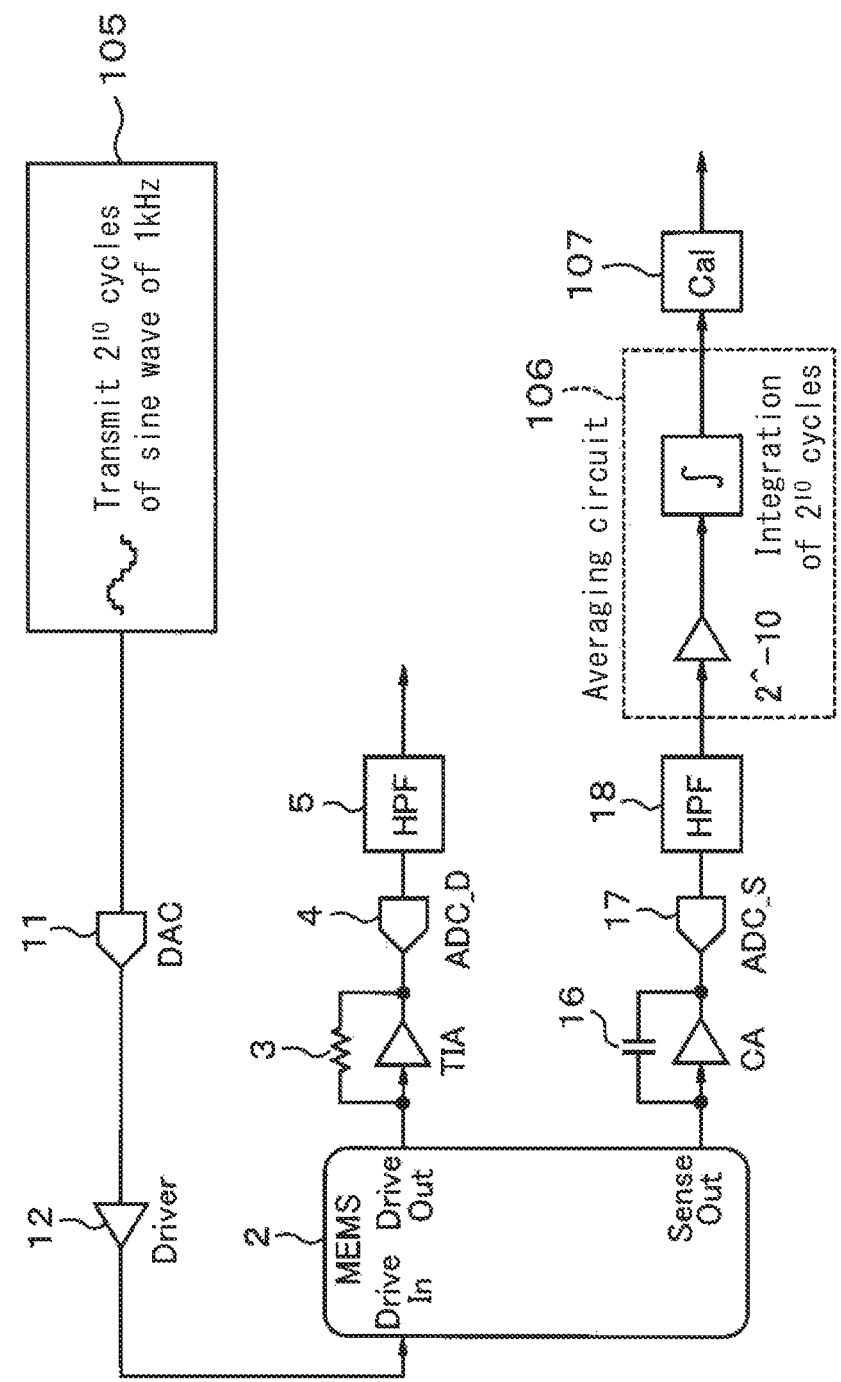
FIG. 26 is a functional block diagram showing a part of a configuration of a vibration type gyroscope.

Here, since the in-phase signal is minute, it is easily buried in other noise. Therefore, the noise intensity is reduced by averaging the signals and the intensity of the in-phase signal is measured. Here, since the drive frequency is known, the sense axis signal is integrated at this frequency. As shown in FIG. 26, a test drive circuit 105 is connected to the input side of the DAC 11. If the frequency Fd is 10 kHz (Fd=10 kHz), a sine wave having a frequency of 1 kHz is input as a test signal for $2^{10}$ cycles. Further, an averaging circuit 106 is arranged on the output side of the HPF 18. The output signals are integrated in $2^{10}$ cycles. The averaging circuit 106 corresponds to an integrator.

Figure 27:
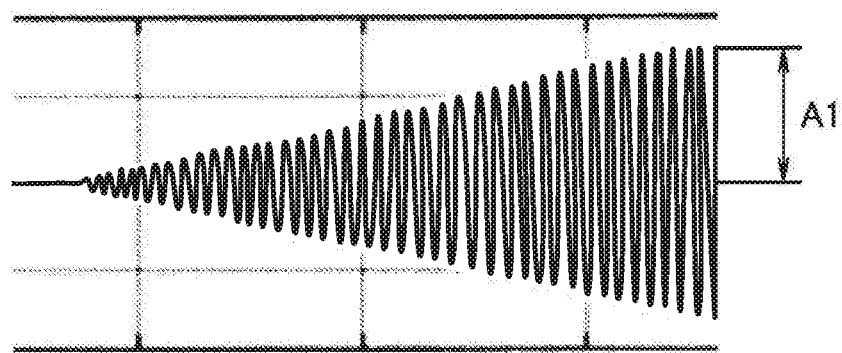
FIG. 27 is a diagram showing a result of simulating an output waveform of an averaging circuit.

FIG. 27 shows a result of simulating an output waveform of the averaging circuit 106. A Cal circuit 107 corrects a difference in gain between the frequency Fd/10 and the frequency Fd on the sense axis with respect to a value A1 obtained as an integration result. The Cal circuit 107 corresponds to a gain correction unit. That is, a value obtained by amplifying an integrated value A1 with a gain of 60 dB is set in an offset register 104 shown in FIG. 21. The circuits 105 to 107 may be connected only at the time of product shipping test, or may be permanently installed in the gyroscope 101 and used by switching paths.

As described above, according to the ninth embodiment, the test drive circuit 105, the averaging circuit 106 and the Cal circuit 107 are provided. The test drive circuit 105 drives the sensor with the test signal having the frequency lower than the resonance frequency Fd of the resonator 2. The averaging circuit 106 integrates the sense axis signal S1 at a cycle period of the test signal for a predetermined time. The Cal circuit 107 corrects the integration result of the averaging circuit 106 in correspondence to the difference in gain due to the difference between the resonance frequency and the test signal frequency. Then, by setting the correction result of the Cal circuit 107 in the Offset register 104, this offset is given to the adders 102 and 103. This makes it possible to cancel the in-phase error and improve the phase correction accuracy.

Tenth Embodiment

Figure 28:
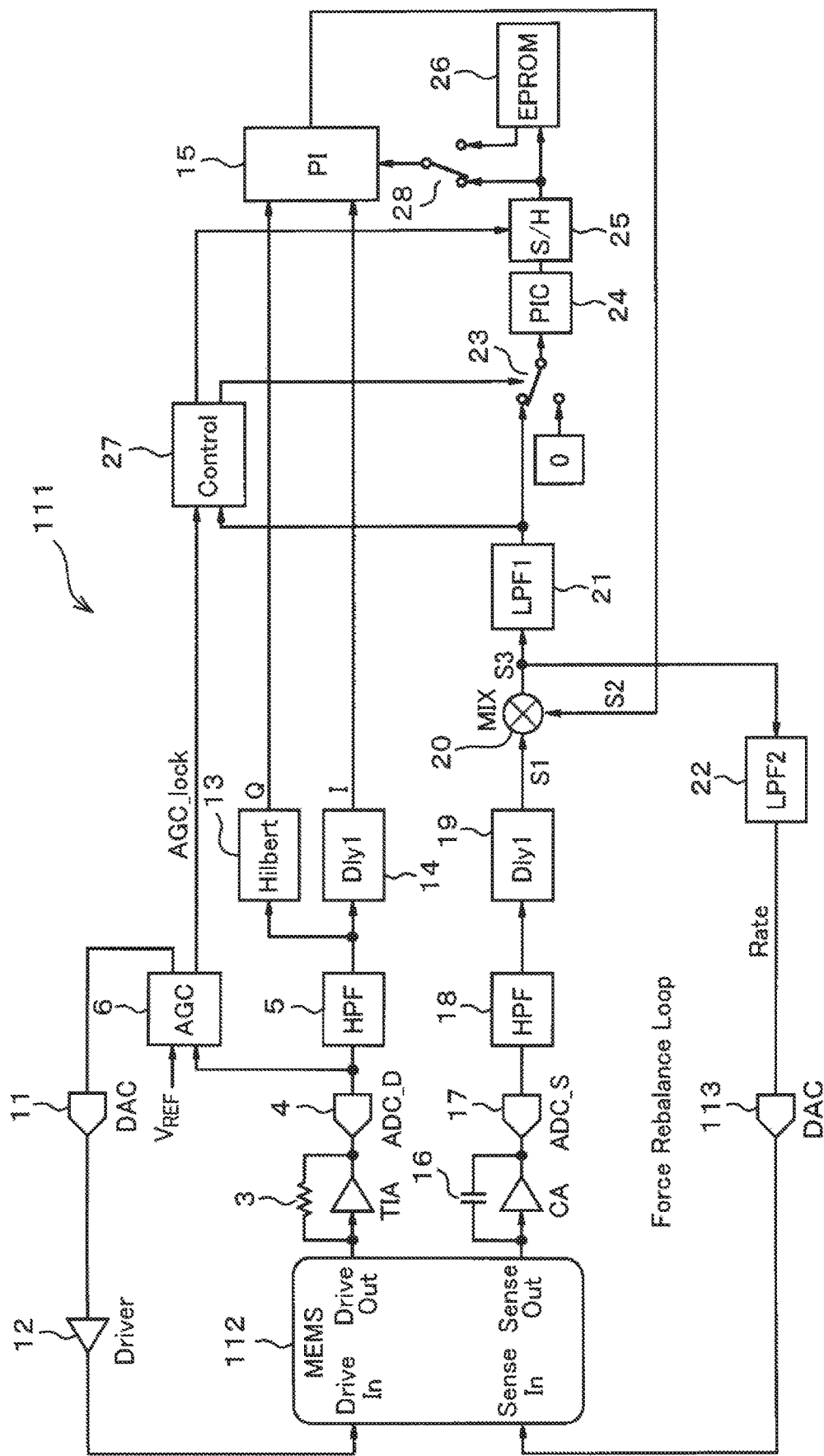
FIG. 28 is a functional block diagram showing a configuration of a vibration type gyroscope according to a tenth embodiment.

A gyroscope 111 of a tenth embodiment shown in FIG. 28 includes a resonator 112 that replaces the resonator 2. The resonator 112 has an input terminal Sense In on the sense axis side, and employs a force rebalance loop architecture that performs feedback control to stop displacement of the sense axis. In correspondence to this architecture, the angular velocity signal Rate output from the LPF2 22 is input to the input terminal Sense In via a DAC 113 in the gyroscope 111.

First, a correct phase correction amount is detected by activating the phase correction loop of the first embodiment, for example, while stopping the force rebalance loop. Then, the force rebalance loop is activated to operate the two loops without interfering with each other. As a result, it is possible to realize a highly accurate sensor that is unlikely to be affected by variations due to the quadrature error by feedback controlling the resonator 112 at the appropriate phase.

Eleventh Embodiment

Figure 29:
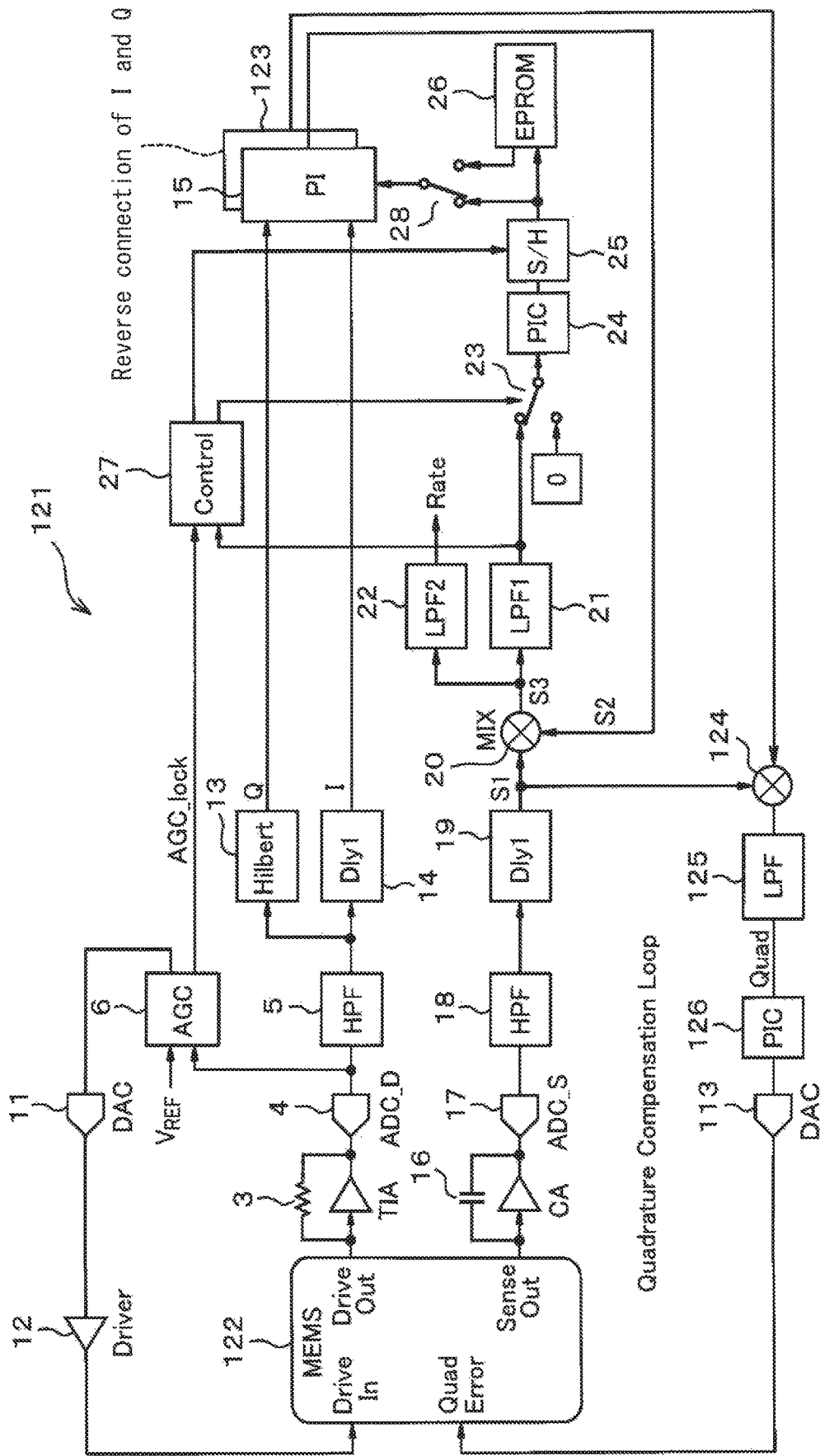
FIG. 29 is a functional block diagram showing a configuration of a vibration type gyroscope according to an eleventh embodiment.

A gyroscope 121 of an eleventh embodiment shown in FIG. 29 includes a resonator 122 that replaces the resonator 2. The resonator 122 has a quadrature error compensation loop including an input terminal Quad Error. The quadrature error correction loop is a loop for minimizing the quadrature error. In correspondence to this, the gyroscope 121 includes another PI circuit 123 in addition to the PI circuit 15. For the PI circuit 123, the I signal and the Q signal applied to the input terminals are reversed. The multiplier 124 multiplies the signal S1 by the output signal of the PI circuit 123, and inputs a multiplication result to the input terminal Quad Error via an LPF 125, a PIC 126, and a DAC 113.

Similarly to the tenth embodiment, the quadrature error correction loop is stopped first and the phase correction loop is operated to obtain the phase correction value. Since the multiplier 124 synchronously detects the sense axis signal S1 by the output signal of the PI circuit 123, the quadrature error signal is obtained. After the phase correction loop has converged, the quadrature error correction loop is operated for convergence. This allows the two loops to operate without interfering with each other as in the tenth embodiment. As described above, according to the eleventh embodiment, the quadrature error can be corrected more accurately in the gyroscope 121 having the quadrature error correction loop.

Twelfth Embodiment

Figure 30:
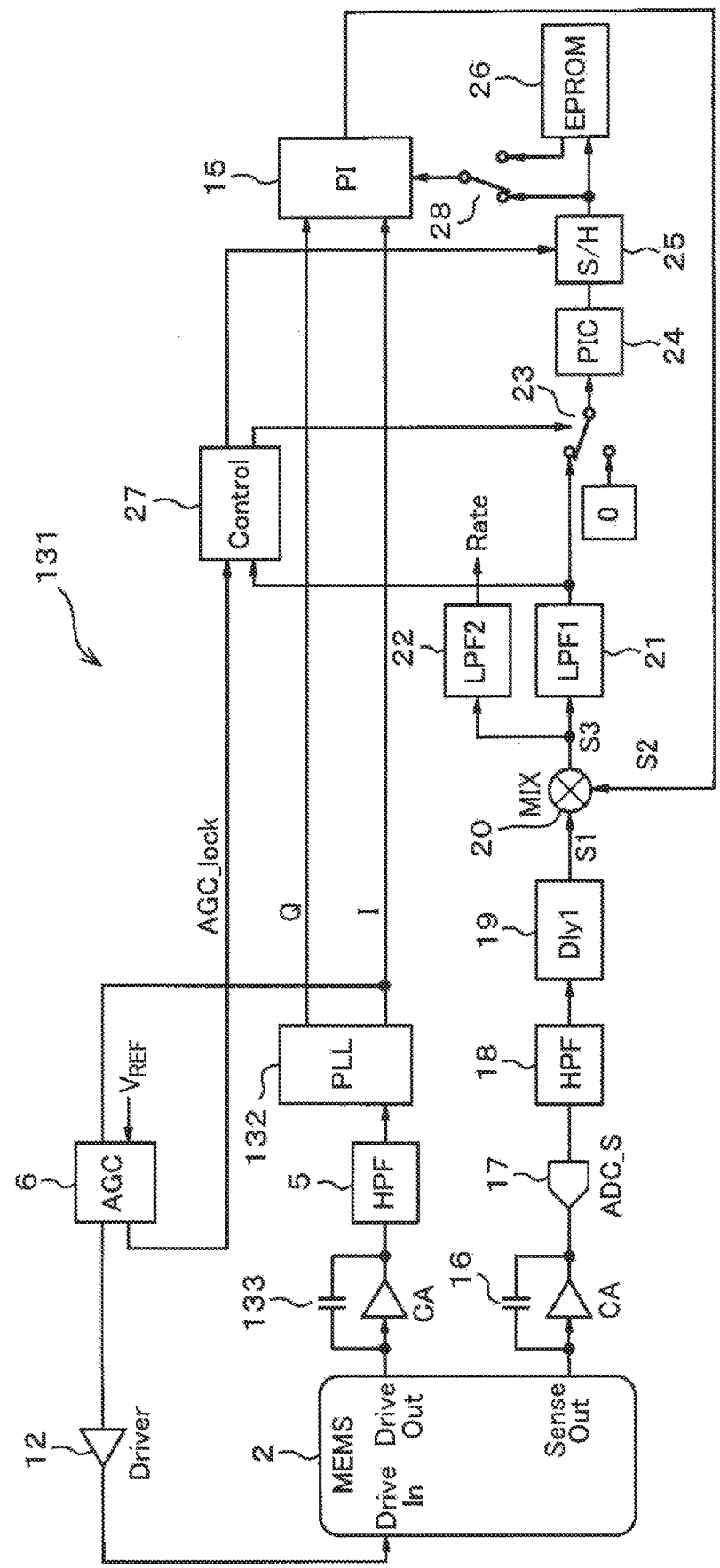
FIG. 30 is a functional block diagram showing a configuration of a vibration type gyroscope according to a twelfth embodiment.

A gyroscope 131 of a twelfth embodiment shown in FIG. 30 uses a PLL circuit 132 as a 90° phase shifter instead of the Hilbert conversion circuit 13. Along with this, the TIA3 is replaced with a CA 133 and the ADC_D4 is removed. In this configuration, by narrowing a bandwidth of the PLL circuit 132, it can be used as a bandpass filter BPF. As a result, the noise contained in the drive axis can be reduced and the phase compensation accuracy can be improved.

Thirteenth Embodiment

Figure 31:
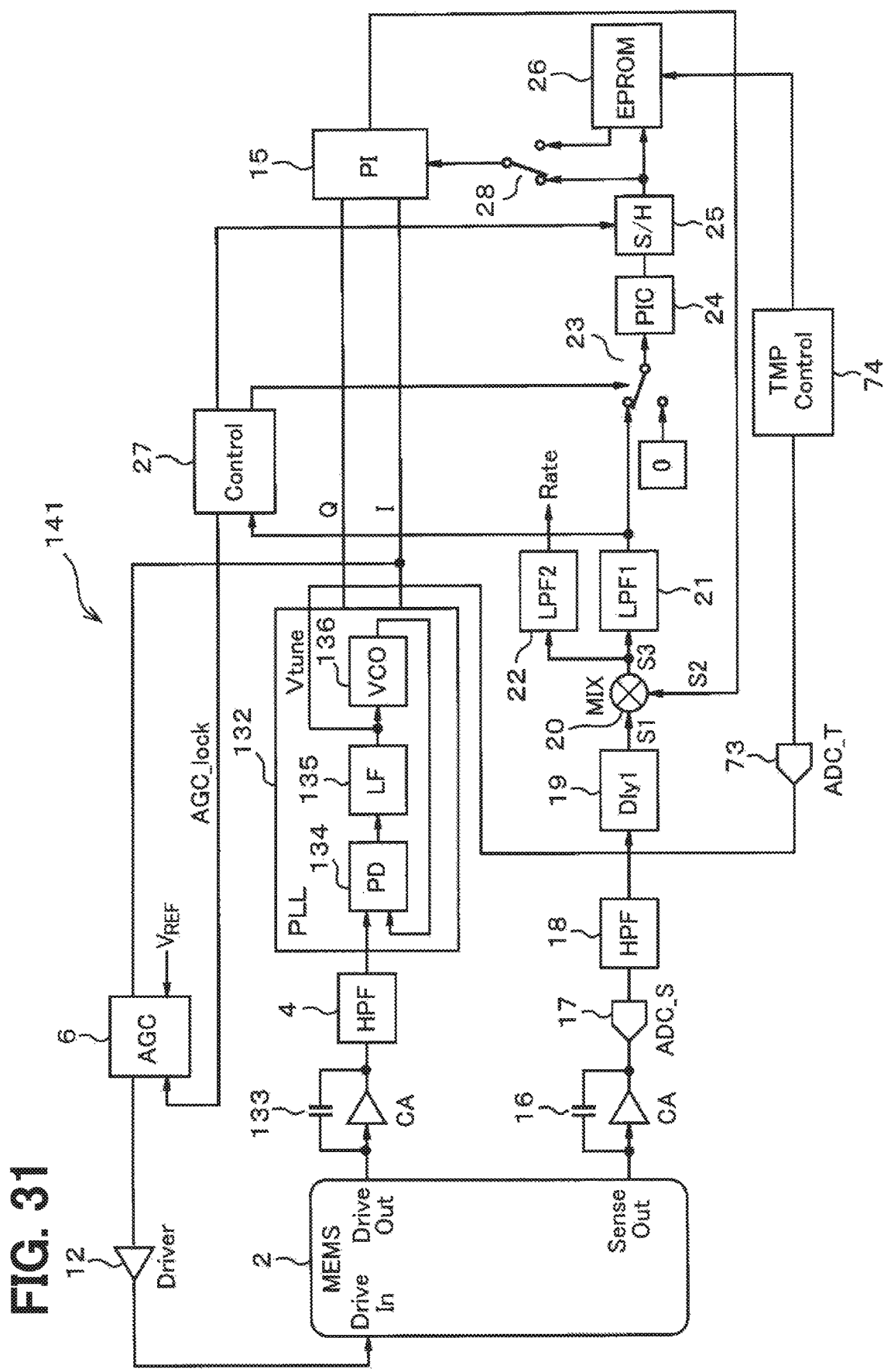
FIG. 31 is a functional block diagram showing a configuration of a vibration type gyroscope according to a thirteenth embodiment.
Figure 32:
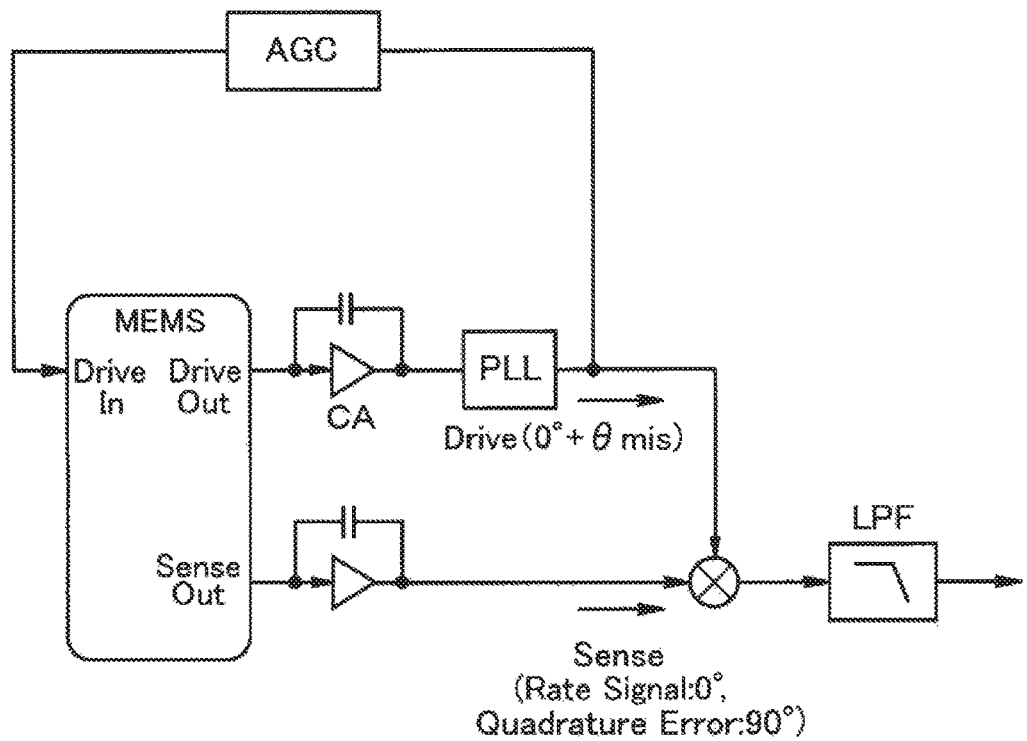
FIG. 32 is a functional block diagram showing a configuration of a conventional vibration type gyroscope.
Figure 33:
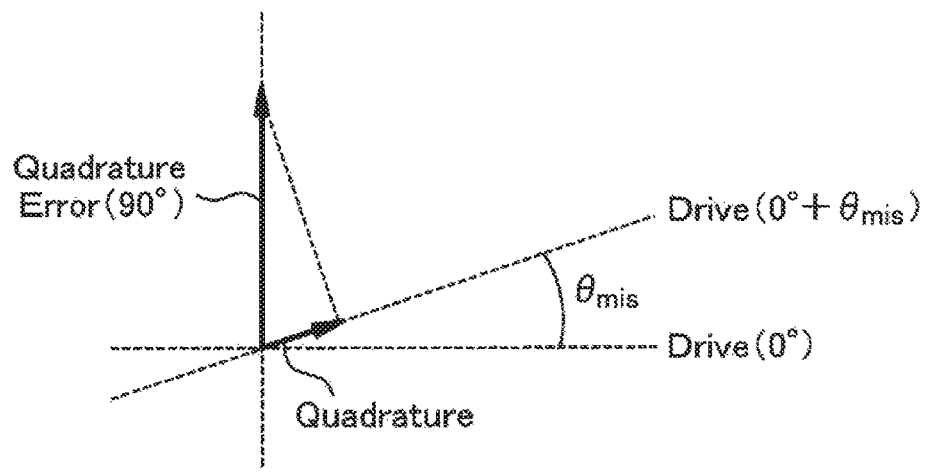
FIG. 33 is a diagram for explaining a quadrature error.

A gyroscope 141 of a thirteenth embodiment shown in FIG. 31 is a combination of the sixth and twelfth embodiments. In place of the temperature sensor 72 of the sixth embodiment, the PLL circuit 132 of the twelfth embodiment is used as a temperature sensor. The PLL circuit 132 includes a phase comparator PD 134, a loop filter LF 135, and a voltage-controlled oscillator VCO 136. The control voltage of the VCO 136 is input to the ADC_T73 as a signal Vtune. The control voltage Vtune can be regarded as a value obtained by converting the resonance frequency of the resonator 2 into a voltage. Since the resonance frequency has temperature dependence, it can be used as a temperature sensor.

Other Embodiment

The specific numerical value of the frequency may be appropriately changed according to the individual design.

The respective embodiments may be appropriately combined for implementation.

The memory is not limited to the EPROM 26, but may be a flash ROM, an EEPROM, an SRAM, or the like.

In the fourth embodiment, the value of each gain in the HBW mode and the LBW mode may be appropriately set without departing from the spirit of the invention.

While the present disclosure has been described with reference to embodiments thereof, it is to be understood that the disclosure is not limited to the embodiments and constructions described above. The present disclosure covers various modification examples and equivalent arrangements. In addition, various combinations and forms, and further, other combinations and forms including only one element, or more or less than these elements are also within the scope of the present disclosure.

What is claimed is:

1. A vibration type gyroscope comprising:
a resonator configured by MEMS structure and having a
drive signal input terminal, a drive signal output terminal and a sense signal output terminal, which outputs a sense signal corresponding to an angular velocity applied from an outside in a state modulated by a drive signal;

a lock state determination unit, provided in a path extending from the drive signal output terminal to the drive signal input terminal, for stabilizing an amplitude of a drive signal output from the drive signal output terminal to be close to a reference voltage value at a time of activation and outputting a lock signal upon a determination that an amplitude variation has been stabilized;

a phase shifter for generating a quadrature signal by 90° phase shifting the drive signal;

a phase compensator for receiving an in-phase signal of the drive signal, the quadrature signal and a control signal, and outputting a phase signal having a phase corresponding to the control signal based on the in-phase signal and the quadrature signal;

a multiplier for multiplying a modulated sense signal by the phase signal output from the phase compensator;

a control low pass filter for filtering a multiplication result of the multiplier;

a proportional-integral (PI) controller for performing a proportional and integral calculation;

a first multiplexer for inputting an output signal of the control low pass filter or a zero level signal to the PI controller by switching;

a memory for storing a control signal output from the PI controller;

a second multiplexer for inputting either one of the control signal output from the PI controller and the control signal stored in the memory to the phase compensator; and a control unit configured to input the zero level signal to the PI controller in an initial state by controlling the first multiplexer, start a phase control by inputting an output signal of the low pass filter to the PI controller when the lock state determination unit outputs the lock signal, and finish the phase control upon the determination that the output signal has been stabilized near a zero level, and writes the control signal output from the PI controller at a determination time of stabilization so that the control signal is stored in the memory.

2. The vibration type gyroscope according to claim 1, wherein:
the phase shifter is a Hilbert conversion circuit.

3. The vibration type gyroscope according to claim 1, further comprising:
a slicer for converting the output signal of the phase compensator into a digital signal.

4. The vibration type gyroscope according to claim 1, wherein:
the phase shifter is a phase locked loop (PLL) circuit.

5. The vibration type gyroscope according to claim 4, further comprising:
a temperature compensation control unit for generating, in a correction mode, a phase correction table by storing the control signal in the memory based on the output signal of a low pass filter forming the PLL circuit, and performing, in a normal mode, temperature compensation processing by reading out control signal data from the phase correction table.

6. The vibration type gyroscope according to claim 1, further comprising:

an output low pass filter for filtering the multiplication result of the multiplier and having a cutoff frequency set higher than that of the control low pass filter.

7. The vibration type gyroscope according to claim 1, further comprising:
a delay circuit, provided in a signal path extending from the sense signal output terminal to the multiplier, for giving a delay time generated in a signal path extending from the phase compensator to the multiplier.

8. The vibration type gyroscope according to claim 1, further comprising:
a moving average circuit for calculating a moving average of the control signal output from the PI controller; and
a third multiplexer for selecting and outputting either one of an output signal of the moving average circuit and the control signal,
wherein the control unit controls the third multiplexer to select the control signal during performing the phase control and select the output signal of the moving average circuit when the phase control is finished.

9. The vibration type gyroscope according to claim 1, further comprising:
an amplifier provided between the control low pass filter and the first multiplexer and capable of varying a gain,
wherein the control unit sets the gain at a predetermined gain until a fixed time elapses from starting the phase control and lowers the gain after the fixed time has elapsed.

10. The vibration type gyroscope according to claim 1, further comprising:
a high frequency band amplitude variation suppression circuit provided in a signal path extending from the drive signal output terminal to the phase shifter, wherein the high frequency amplitude variation suppression circuit includes:
a peak value detection circuit for detecting a peak-to-peak value of the amplitude of the drive signal;
a moving average circuit for calculating a moving average of an output signal of the peak value detection circuit;
a reciprocal circuit for calculating a reciprocal of an output signal of the moving average circuit; and
a multiplier for multiplying the drive signal by an output signal of the reciprocal circuit.

11. The vibration type gyroscope according to claim 1, further comprising:
a temperature sensor for detecting a temperature of the resonator; and
a temperature compensation control unit for generating, in a correction mode, a phase correction table by storing a control signal in the memory based on the temperature, and performing, in a normal mode, temperature compensation processing by reading out control signal data from the phase correction table based on a detected temperature.

12. The vibration type gyroscope according to claim 1, further comprising:
a determination unit for determining an abnormality by comparing the control signal output from the PI controller and the control signal stored in the memory.

13. The vibration type gyroscope according to claim 1, further comprising:
an offset circuit for giving an offset to an output signal of the control low pass filter thereby to cancel an in-phase error component included in a sense signal output from the resonator.

14. The vibration type gyroscope according to claim 13, further comprising:

a test drive circuit for driving the resonator by a test signal of a frequency lower than a resonance frequency of the resonator;

an integrator for integrating the sense signal at a cycle period of the test signal for a fixed time; and a gain correction unit for correcting an integration result of the integrator based on a gain difference caused by a difference between the resonance frequency and the frequency of the test signal, wherein the offset circuit sets the offset to a correction result of the gain correction unit.

15. The vibration type gyroscope according to claim 1, further comprising:

a feedback low pass filter for feeding back a filtered output signal of the multiplier to a sense signal input terminal of the resonator in a feedback loop architecture for suppressing fluctuation of the sense signal.

16. The vibration type gyroscope according to claim 1, further comprising:

a second phase compensator having input terminals for receiving an in-phase signal and an out-phase signal in a manner opposite to a signal input relation of a first phase compensator provided as the phase compensator of claim 1, in a feedback loop architecture for compensating the quadrature error;

a multiplier for multiplying the sense signal by an output signal of the second phase compensator;

a feedback low pass filter for filtering an output signal of the multiplier; and another proportional-integral (PI) controller for performing proportional and integral calculations on an output signal of the feedback low pass filter and inputting a control result to a quadrature error signal input terminal of the resonator.

* * * * *